(12) United States Patent
Choi et al.

(10) Patent No.: US 9,281,228 B2
(45) Date of Patent: *Mar. 8, 2016

(54) SEMICONDUCTOR DEVICE AND METHOD OF FORMING THERMAL INTERFACE MATERIAL AND HEAT SPREADER OVER SEMICONDUCTOR DIE

(75) Inventors: DaeSik Choi, Seoul (KR); JoungIn Yang, Seoul (KR); MinJung Kim, Kyounggi-do (KR); Sang Mi Park, Kyounggi-do (KR); MinWook Yu, Gyeonggi-do (KR)

(73) Assignee: STATS ChipPAC, Ltd., Singapore (SG)

(*) Notice: Subject to any disclaimer, the term of this patent is extended or adjusted under 35 U.S.C. 154(b) by 767 days.

This patent is subject to a terminal disclaimer.

(21) Appl. No.: 13/287,035

(22) Filed: Nov. 1, 2011

(65) Prior Publication Data
US 2013/0105963 A1 May 2, 2013

(51) Int. Cl.
*H01L 21/00* (2006.01)
*H01L 21/683* (2006.01)
(Continued)

(52) U.S. Cl.
CPC .......... *H01L 21/6835* (2013.01); *H01L 23/36* (2013.01); *H01L 23/42* (2013.01); *H01L 24/05* (2013.01); *H01L 24/32* (2013.01); *H01L 24/34* (2013.01); *H01L 24/36* (2013.01); *H01L 24/40* (2013.01); *H01L 24/73* (2013.01); *H01L 24/92* (2013.01); *H01L 24/97* (2013.01); *H01L 25/0655* (2013.01); *H01L 29/0657* (2013.01); *H01L 24/13* (2013.01); *H01L 24/16* (2013.01); *H01L 24/29* (2013.01); *H01L 24/81* (2013.01); *H01L 24/83* (2013.01); *H01L 2221/68345* (2013.01); *H01L 2224/0345* (2013.01); *H01L 2224/0346* (2013.01); *H01L 2224/03452* (2013.01); *H01L 2224/0401* (2013.01); *H01L 2224/04026* (2013.01); *H01L 2224/04042* (2013.01); *H01L 2224/05571* (2013.01); *H01L 2224/05611* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/1132* (2013.01);
(Continued)

(58) Field of Classification Search
CPC ... H01L 23/36; H01L 23/3677; H01L 23/427; H01L 2924/14
USPC ................ 257/706, 707, 712, 713, 720, 722; 438/122
See application file for complete search history.

(56) References Cited

U.S. PATENT DOCUMENTS 6,225,695 B1   5/2001   Chia et al.
6,906,413 B2 *  6/2005   Bish et al. ..................... 257/706
(Continued)

*Primary Examiner* — S. V. Clark
(74) *Attorney, Agent, or Firm* — Robert D. Atkins; Patent Law Group: Atkins and Associates, P.C.

(57) ABSTRACT

A semiconductor device has a semiconductor die mounted to a substrate. A recess is formed in a back surface of the semiconductor die to an edge of the semiconductor die with sidewalls on at least two sides of the semiconductor die. The sidewalls are formed by removing a portion of the back surface of the die, or by forming a barrier layer on at least two sides of the die. A channel can be formed in the back surface of the semiconductor die to contain the TIM. A TIM is formed in the recess. A heat spreader is mounted in the recess over the TIM with a down leg portion of the heat spreader thermally connected to the substrate. The sidewalls contain the TIM to maintain uniform coverage of the TIM between the heat spreader and back surface of the semiconductor die.

32 Claims, 24 Drawing Sheets

(51) Int. Cl.
   *H01L 23/36*      (2006.01)
   *H01L 23/42*      (2006.01)
   *H01L 29/06*      (2006.01)
   *H01L 25/065*     (2006.01)
   *H01L 23/00*      (2006.01)

(52) U.S. Cl.
   CPC .......... *H01L 2224/1145* (2013.01); *H01L 2224/1146* (2013.01); *H01L 2224/11334* (2013.01); *H01L 2224/11849* (2013.01); *H01L 2224/11901* (2013.01); *H01L 2224/131* (2013.01); *H01L 2224/13111* (2013.01); *H01L 2224/13113* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/16225* (2013.01); *H01L 2224/26145* (2013.01); *H01L 2224/29007* (2013.01); *H01L 2224/29011* (2013.01); *H01L 2224/2919* (2013.01); *H01L 2224/32225* (2013.01); *H01L 2224/32245* (2013.01); *H01L 2224/40095* (2013.01); *H01L 2224/40225* (2013.01); *H01L 2224/48091* (2013.01); *H01L 2224/73204* (2013.01); *H01L 2224/73253* (2013.01); *H01L 2224/73265* (2013.01); *H01L 2224/81191* (2013.01); *H01L 2224/81815* (2013.01); *H01L 2224/83104* (2013.01); *H01L 2224/83191* (2013.01); *H01L 2224/92125* (2013.01); *H01L 2224/92225* (2013.01); *H01L 2224/94* (2013.01); *H01L 2224/97* (2013.01); *H01L 2924/00014* (2013.01); *H01L 2924/01322* (2013.01); *H01L 2924/10158* (2013.01); *H01L 2924/12041* (2013.01); *H01L 2924/12042* (2013.01); *H01L 2924/1306* (2013.01); *H01L 2924/13091* (2013.01); *H01L 2924/15311* (2013.01); *H01L 2924/16251* (2013.01); *H01L 2924/181* (2013.01); *H01L 2924/19105* (2013.01)

(56) References Cited

U.S. PATENT DOCUMENTS

| | | | |
|---|---|---|---|
| 7,015,577 | B2 | 3/2006 | Wang |
| 7,361,972 | B2 * | 4/2008 | Chen .............................. 257/622 |
| 7,755,184 | B2 * | 7/2010 | Macris et al. ................. 257/706 |
| 7,928,562 | B2 * | 4/2011 | Arvelo et al. ................. 257/712 |
| 8,786,076 | B2 * | 7/2014 | Kim et al. ..................... 257/707 |
| 2012/0241941 | A1 | 9/2012 | Kim et al. |
| 2012/0306104 | A1 | 12/2012 | Choi et al. |

* cited by examiner

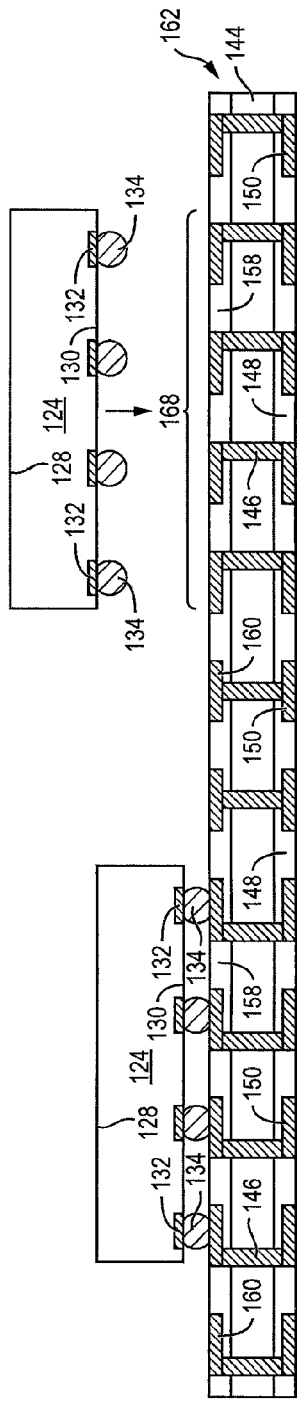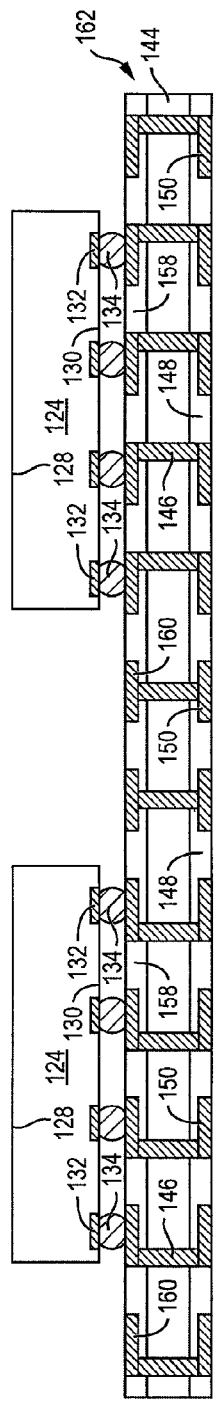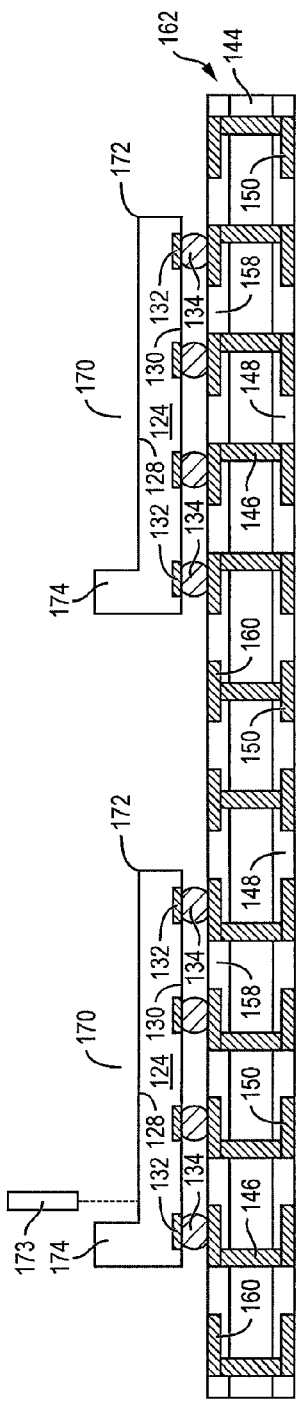

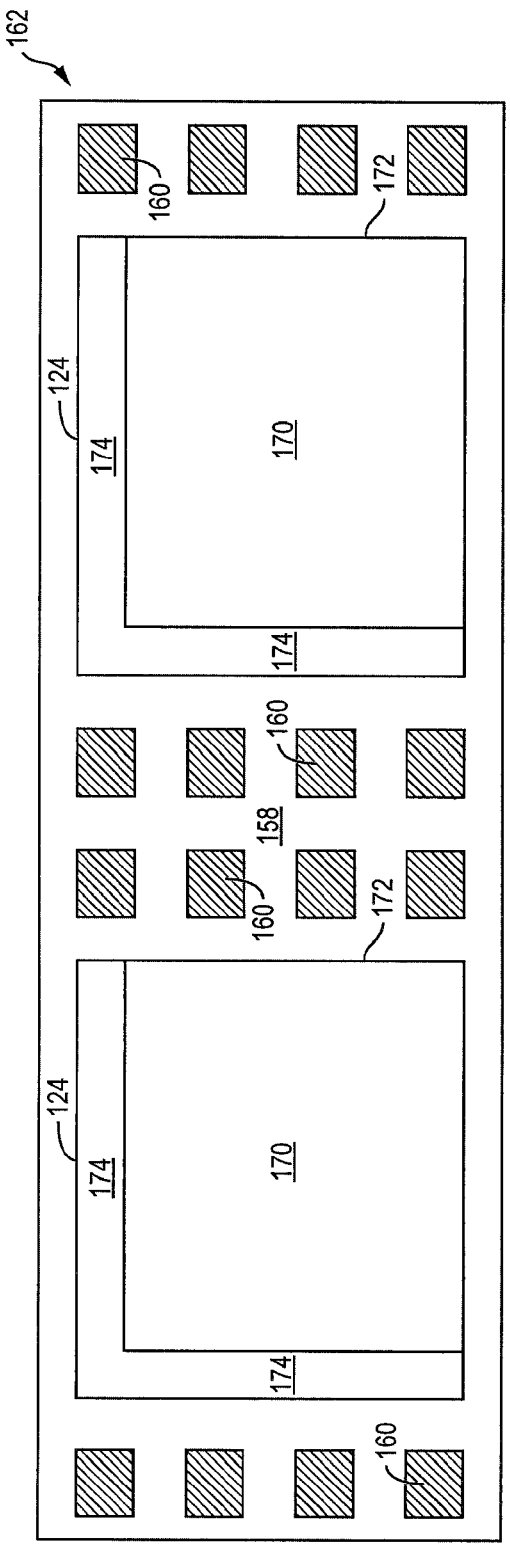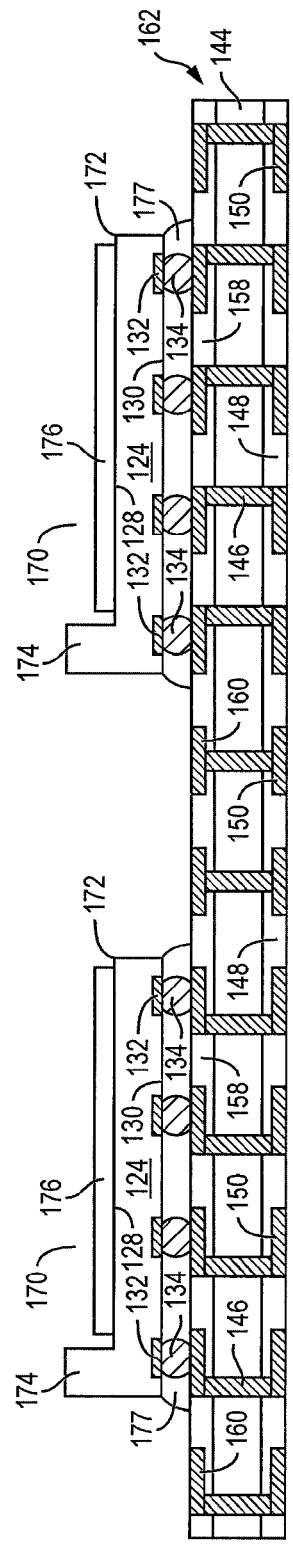

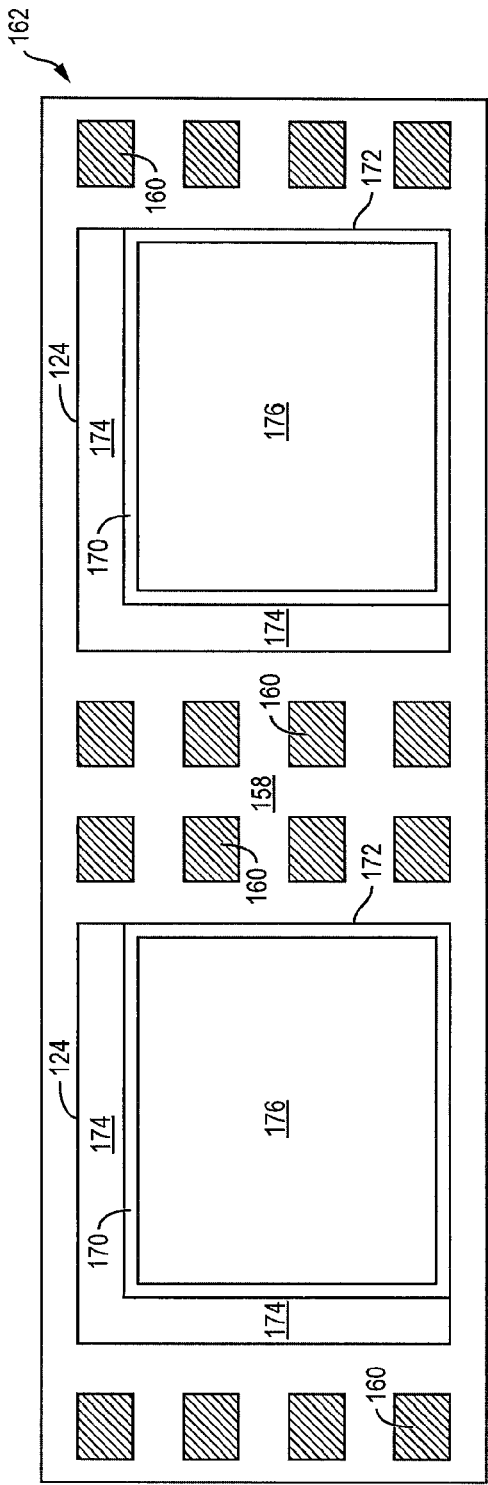
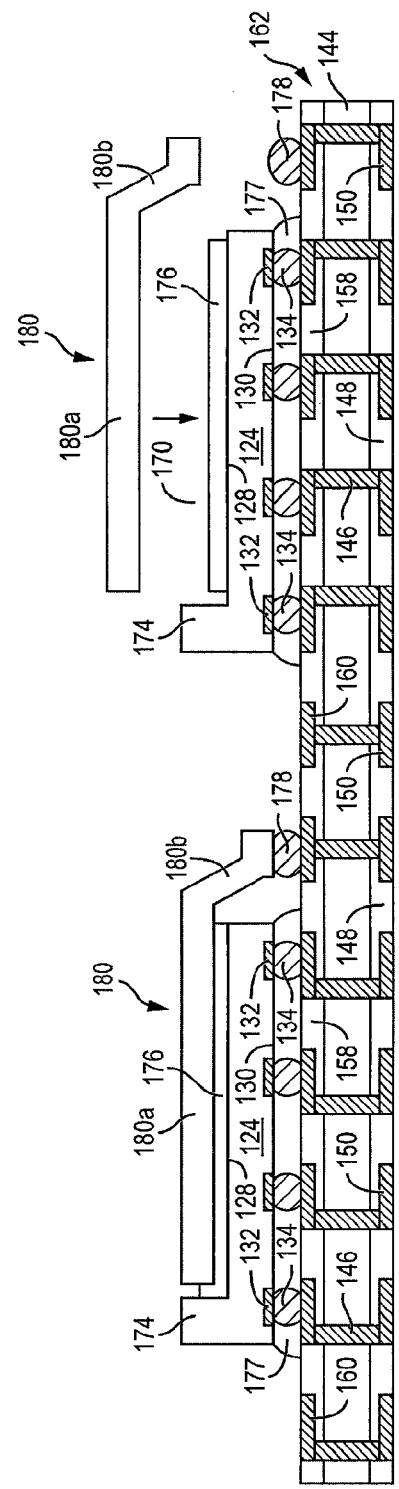
FIG. 6f
FIG. 6g

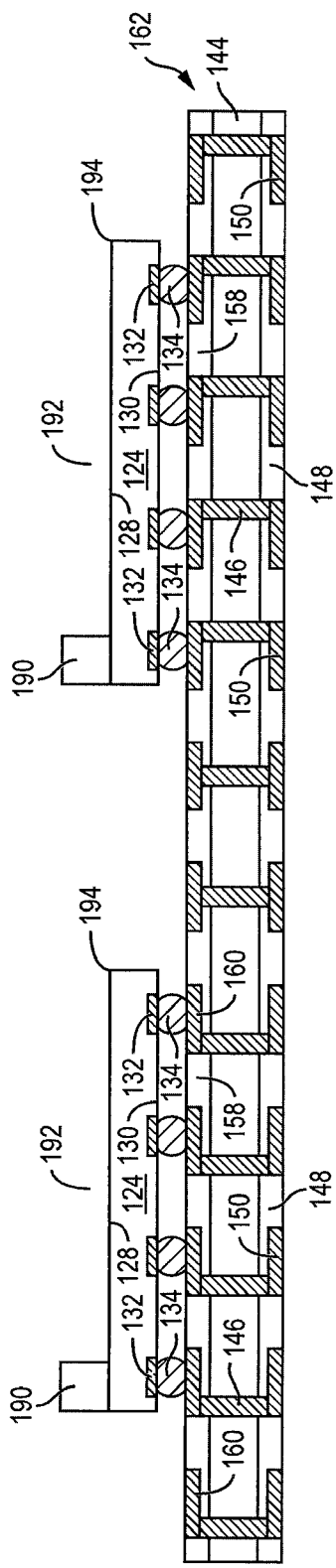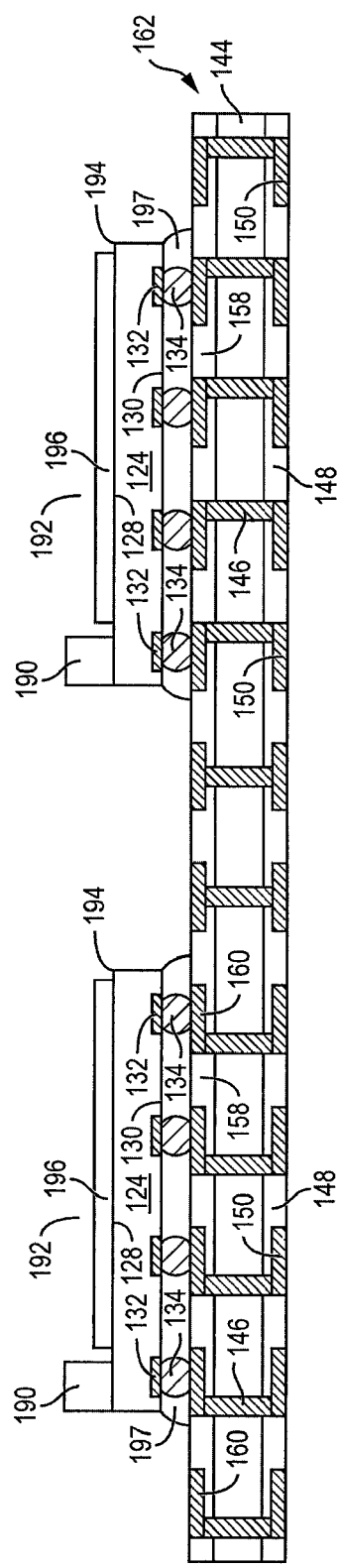

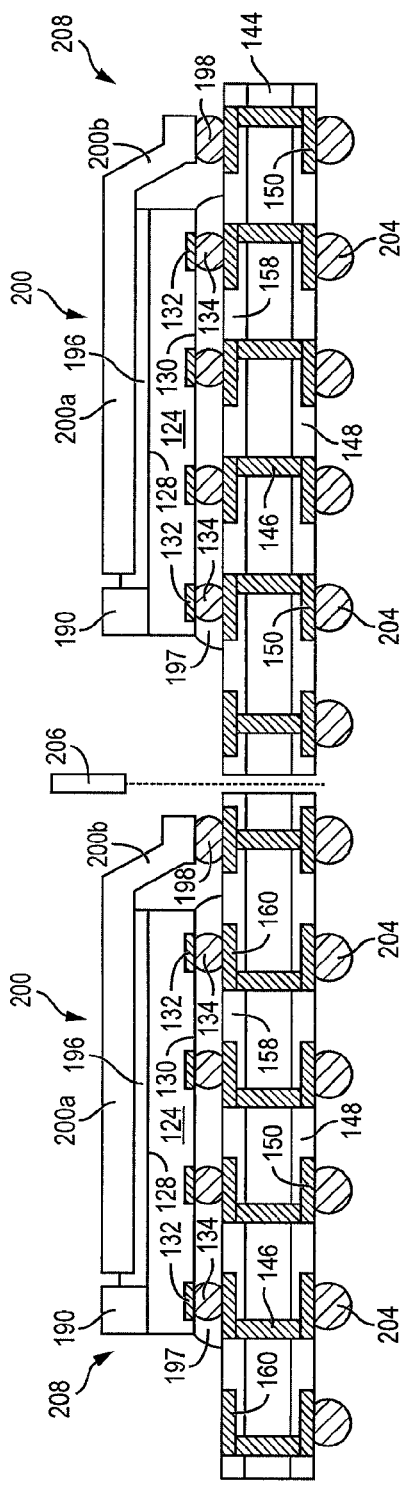
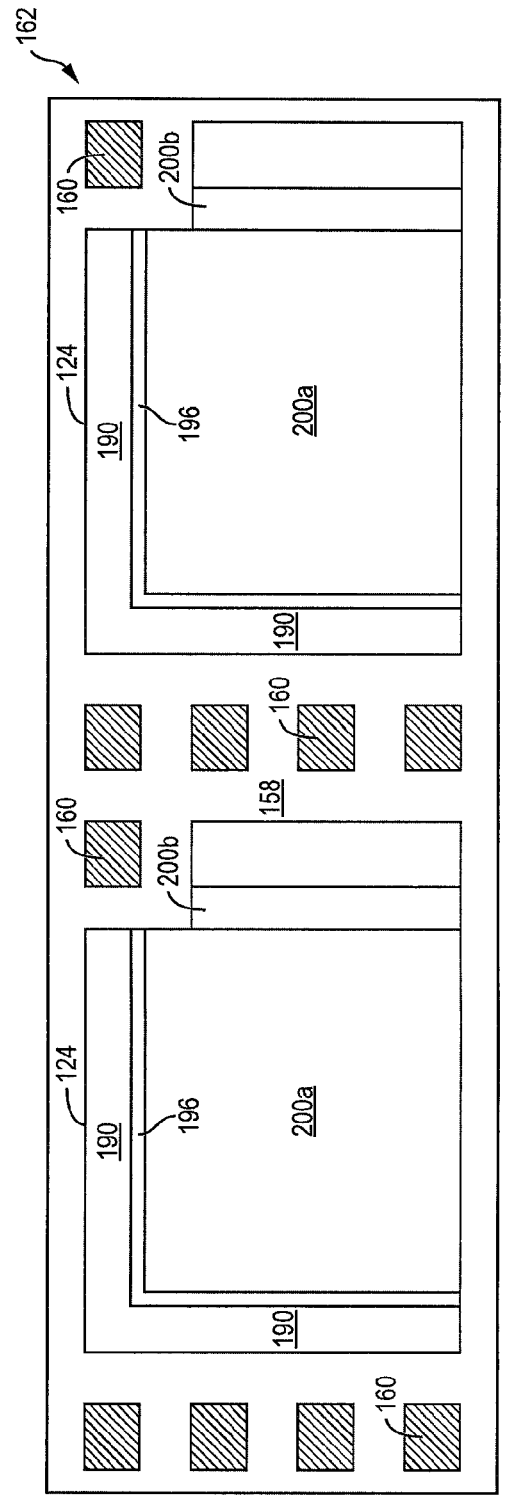
FIG. 8e
FIG. 8f

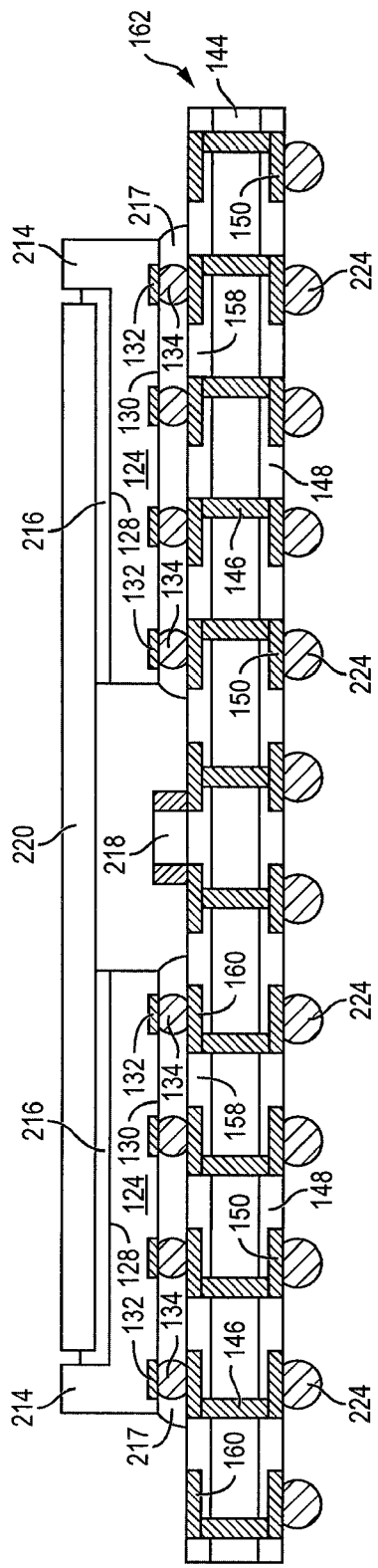
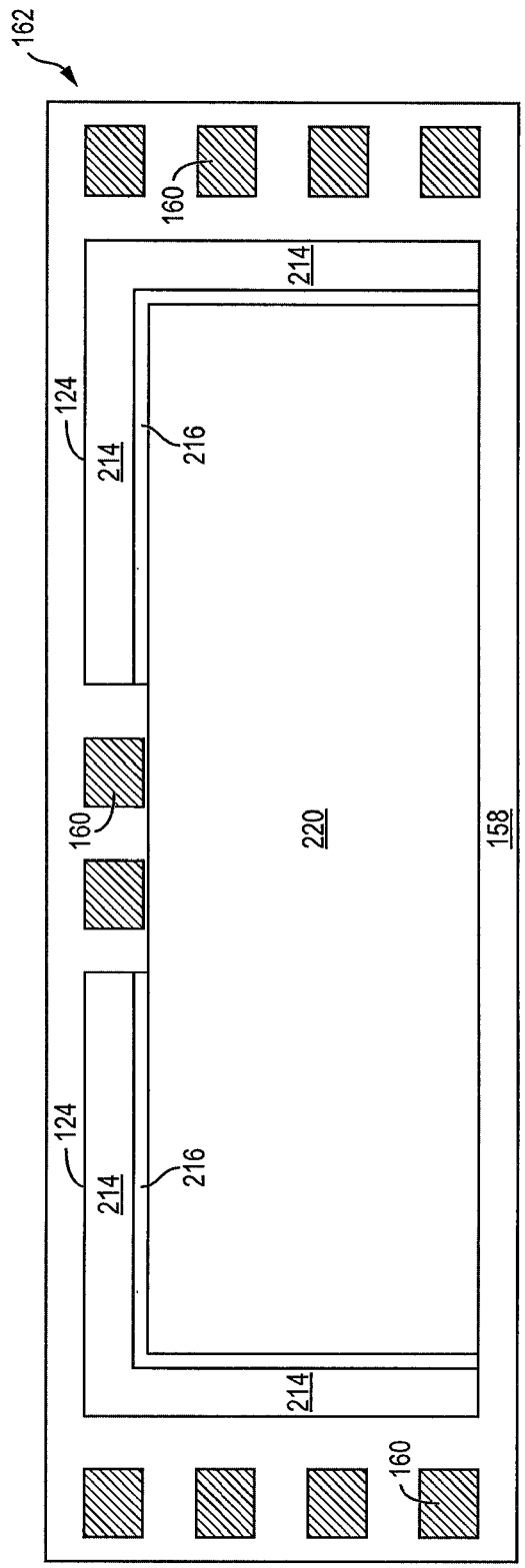

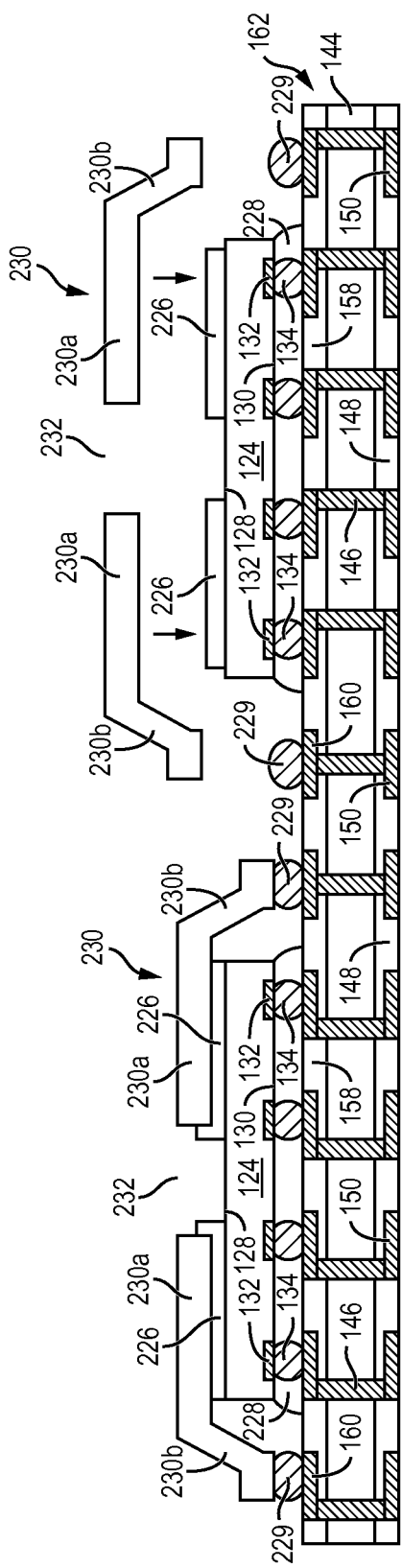
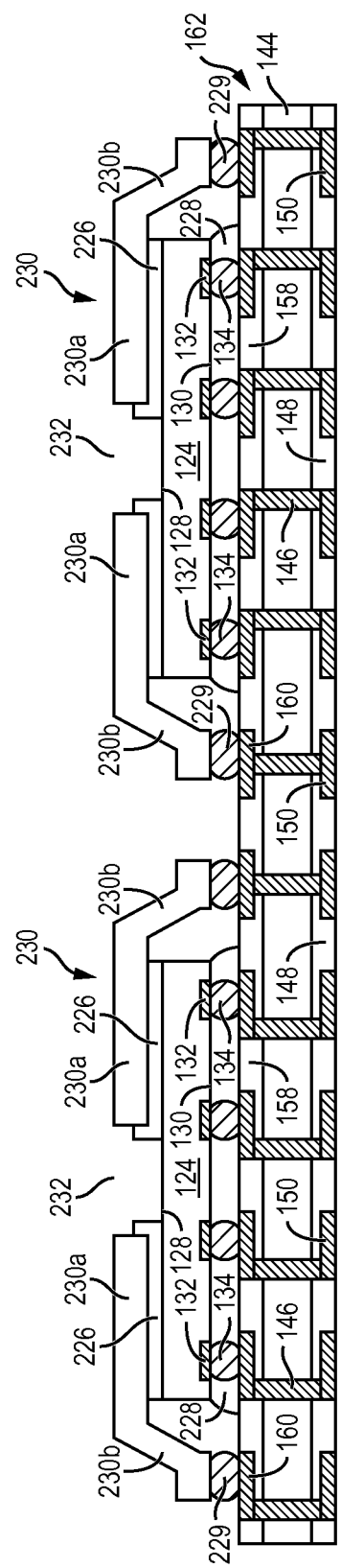
FIG. 11c
FIG. 11d

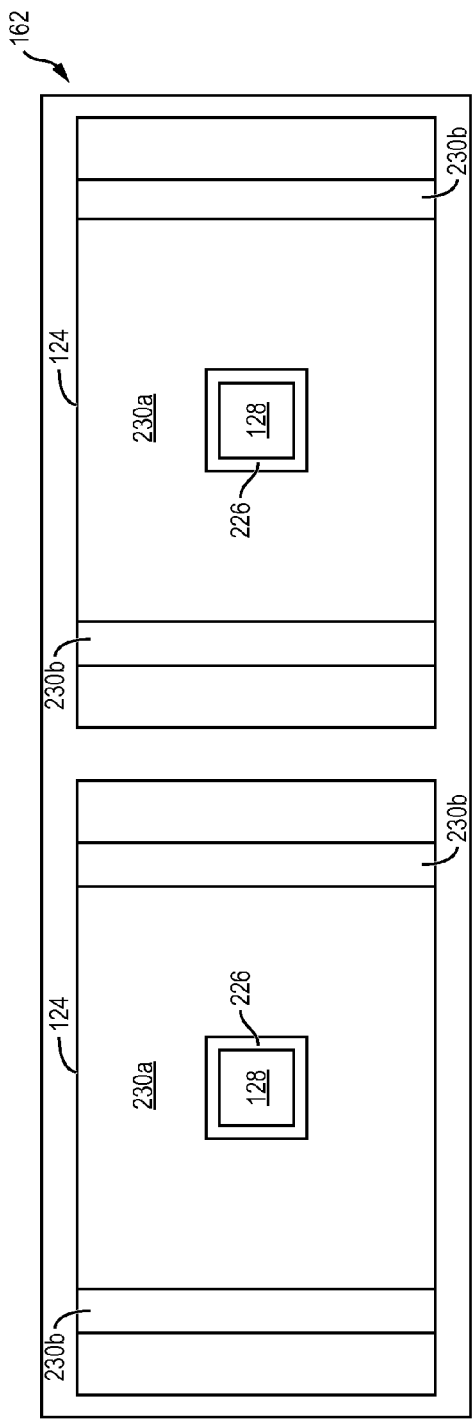
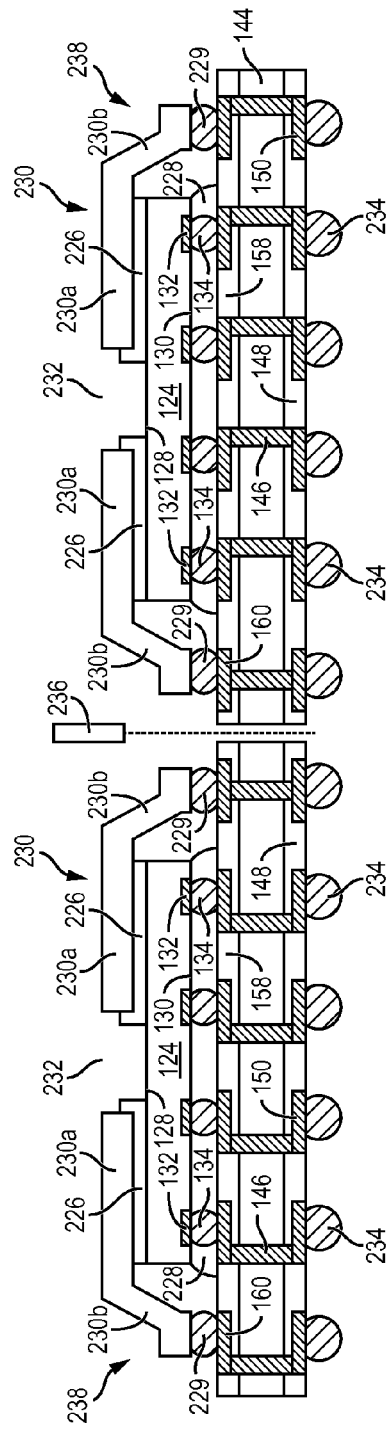
FIG. 11e
FIG. 11f

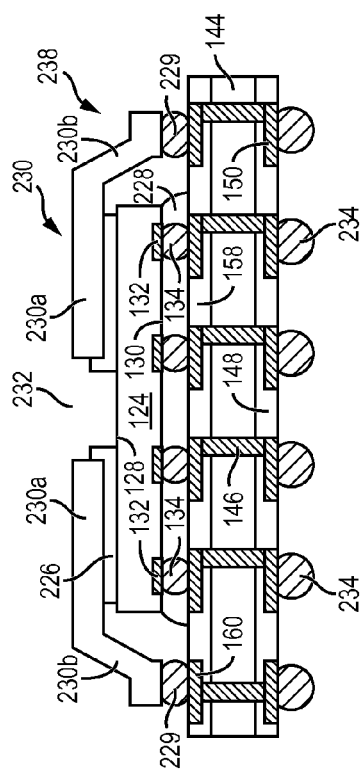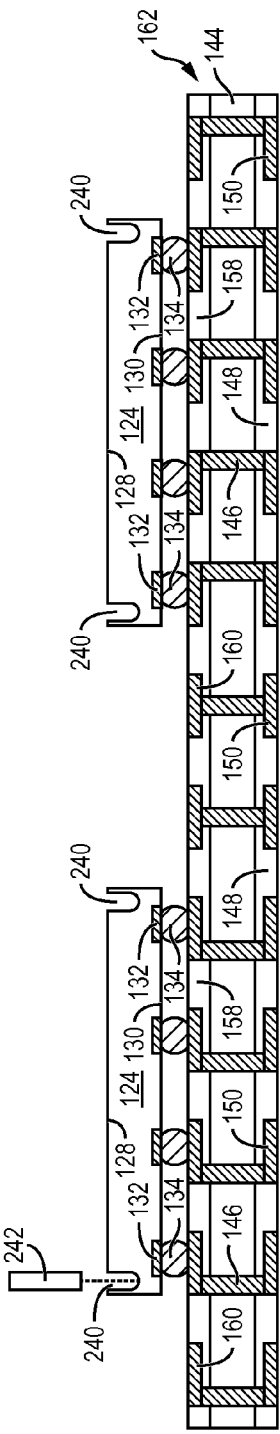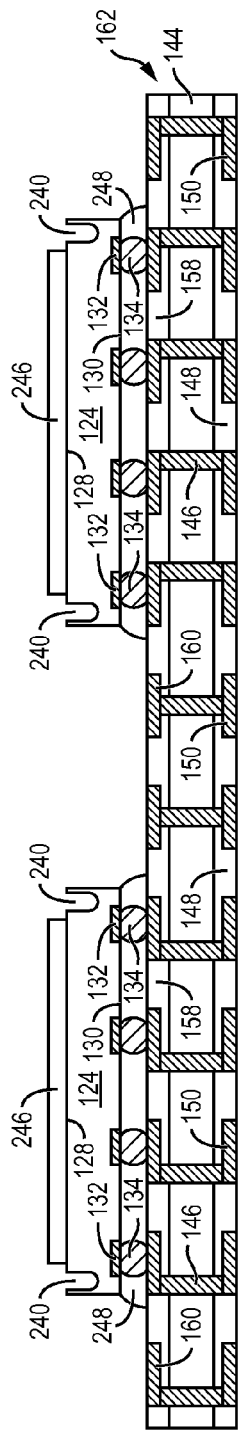

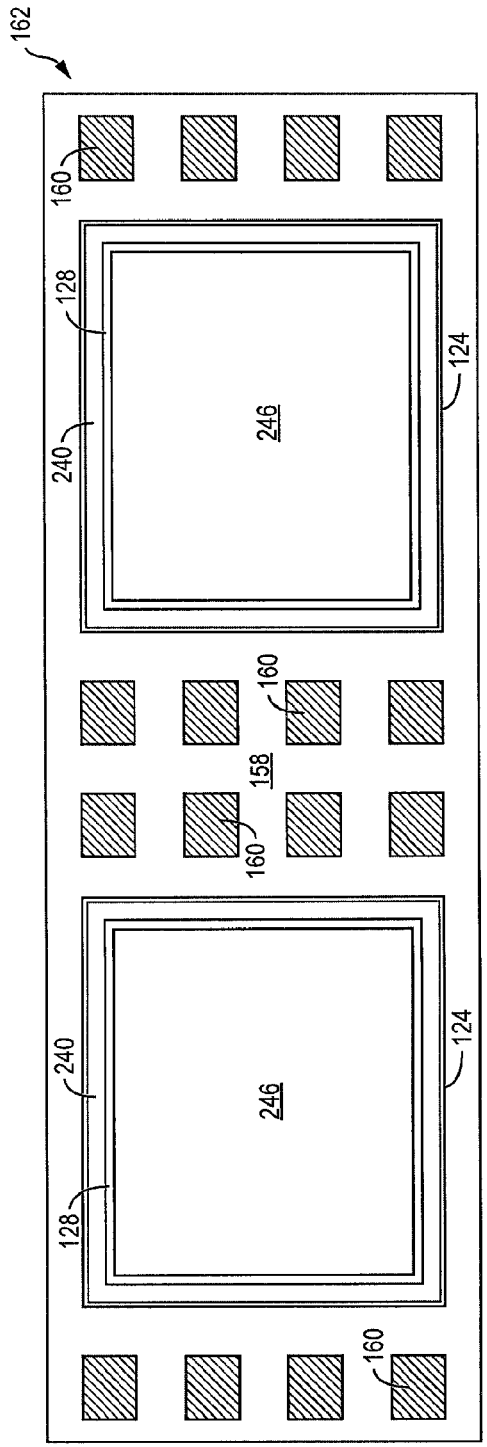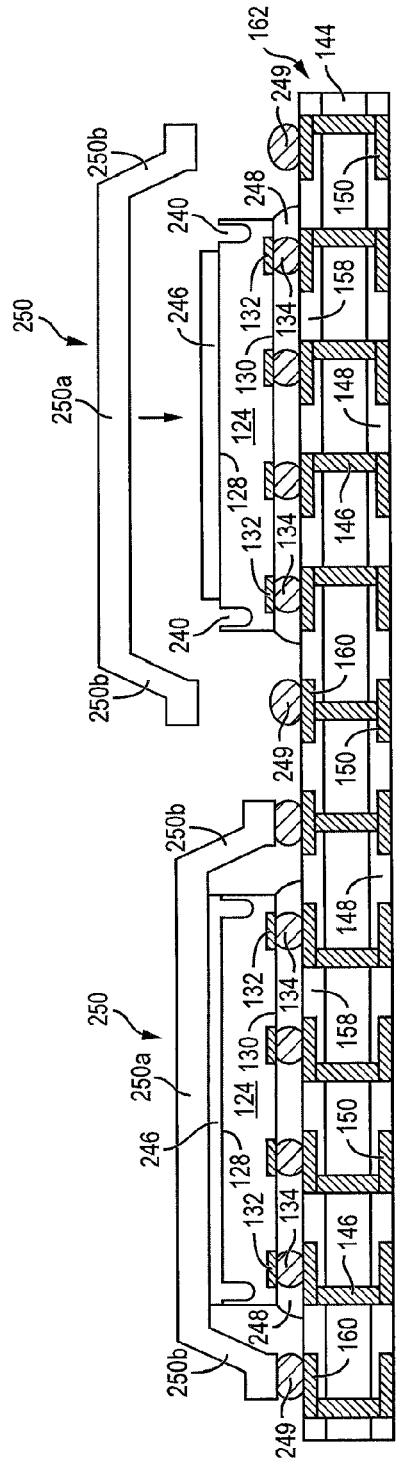
FIG. 13c
FIG. 13d

SEMICONDUCTOR DEVICE AND METHOD OF FORMING THERMAL INTERFACE MATERIAL AND HEAT SPREADER OVER SEMICONDUCTOR DIE

FIELD OF THE INVENTION

The present invention relates in general to semiconductor devices and, more particularly, to a semiconductor device and method of forming a thermal interface material and heat spreader over a semiconductor die.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

Another goal of semiconductor manufacturing is to produce semiconductor devices with adequate heat dissipation. High frequency semiconductor devices generally generate more heat. Without effective heat dissipation, the generated heat can reduce performance, decrease reliability, and reduce the useful lifetime of the semiconductor device.

FIG. 1a shows a conventional semiconductor package 10 with a semiconductor die 12 having an active surface 14. Bumps 16 are formed on contact pads 18 on active surface 14. Semiconductor die 12 is mounted to substrate 20 with bumps 16 electrically connected to conductive traces 22 on the substrate. Bumps 24 are formed on conductive traces 22 opposite semiconductor die 12. An underfill material 26 is deposited between semiconductor die 12 and substrate 20.

A thermal interface material (TIM) 30 is formed over back surface 28 of semiconductor die 12. A heat spreader or heat sink 32 is positioned over and mounted to TIM 30 over back surface 28 of semiconductor die 12, as shown in FIG. 1b. The pressure of mounting heat spreader 32 to TIM 30 forces a spreading or pump-out of TIM 30 from back surface 28 of semiconductor die 12. The pump-out of TIM 30 can also occur during power cycling and other conditions of thermal mechanical stress of semiconductor package 10. The pump-out of TIM 30 can create voids 34 in the TIM over back surface 28. The thinner coverage of TIM 30 over back surface 28, as well as the potential voids, reduces the thermal conductivity and efficiency of TIM 30 and heat spreader 32. The pump-out of TIM 30 can cause overheating and reduce the meantime between failures of semiconductor package 10.

SUMMARY OF THE INVENTION

A need exists to maintain a design thickness of the TIM over a semiconductor die when mounting a heat spreader for efficient thermal conductivity. Accordingly, in one embodiment, the present invention is a method of making a semiconductor device comprising the steps of providing a substrate, providing a semiconductor die, mounting the semiconductor die to the substrate, forming a recess in a back surface of the semiconductor die to an edge of the semiconductor die with sidewalls on at least two sides of the semiconductor die, forming a thermal interface material in the recess, and mounting a heat spreader in the recess with a down leg portion of the heat spreader thermally connected to the substrate. The sidewalls contain the thermal interface material to maintain uniform coverage of the thermal interface material between the heat spreader and back surface of the semiconductor die.

In another embodiment, the present invention is a method of making a semiconductor device comprising the steps of providing a substrate, providing a semiconductor die, mounting the semiconductor die to the substrate, forming a recess in a back surface of the semiconductor die to an edge of the semiconductor die with sidewalls on at least two sides of the semiconductor die, forming a thermal interface material in the recess, and mounting a heat spreader in the recess.

In another embodiment, the present invention is a method of making a semiconductor device comprising the steps of providing a substrate, providing a semiconductor die, mounting the semiconductor die to the substrate, forming a thermal interface material over a back surface of the semiconductor die, and mounting a heat spreader over the thermal interface material. The heat spreader has a down leg portion thermally connected to the substrate.

In another embodiment, the present invention is a semiconductor device comprising a substrate and semiconductor die mounted to the substrate. A recess is formed in a back surface of the semiconductor die to an edge of the semiconductor die with sidewalls on at least two sides of the semiconductor die. A thermal interface material is deposited in the recess. A heat spreader is mounted in the recess.

BRIEF DESCRIPTION OF THE DRAWINGS

FIGS. 6a-6j illustrate a process of forming a TIM and heat spreader within a recess defined by sidewalls in a back surface of a semiconductor die;

FIGS. 8a-8f illustrate a process of forming a TIM and heat spreader within a recess defined by a barrier layer over a back surface of a semiconductor die;

FIGS. 10a-10g illustrate a process of forming a TIM and heat spreader within a recess defined by sidewalls in a back surface of adjacent semiconductor die;

FIGS. 11a-11f illustrate a process of forming a TIM and heat spreader over a back surface of a semiconductor die;

FIG. 12 illustrates the TIM and heat spreader formed over the back surface of the semiconductor die according to FIGS. 11a-11f;

FIGS. 13a-13g illustrate another process of forming a TIM and heat spreader over a back surface of a semiconductor die.

DETAILED DESCRIPTION OF THE DRAWINGS

Figure 1A:
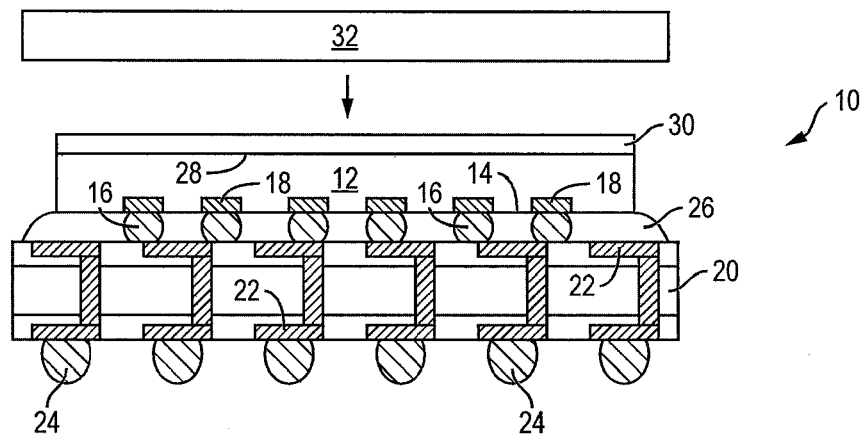
FIGS. 1a-1b illustrate a conventional semiconductor package with TIM and heat spreader.
Figure 1B:
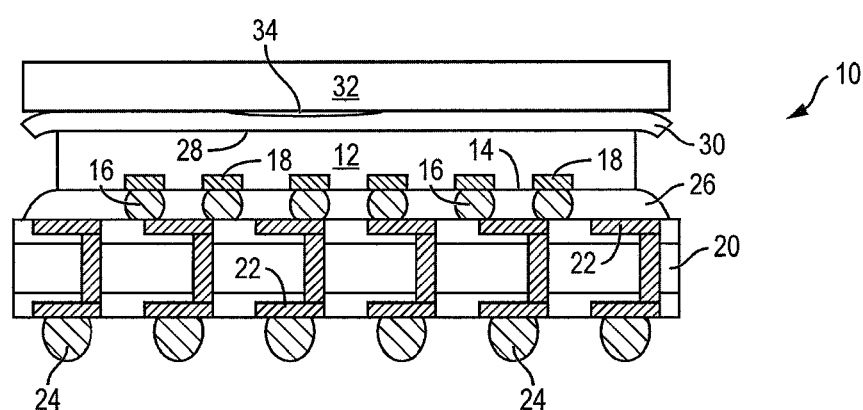

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed. The process of forming, exposing, and removing the photoresist, as well as the process of removing a portion of the semiconductor wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisopremes. Removing the soluble portions (i.e. the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photo-solubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e. the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 2:
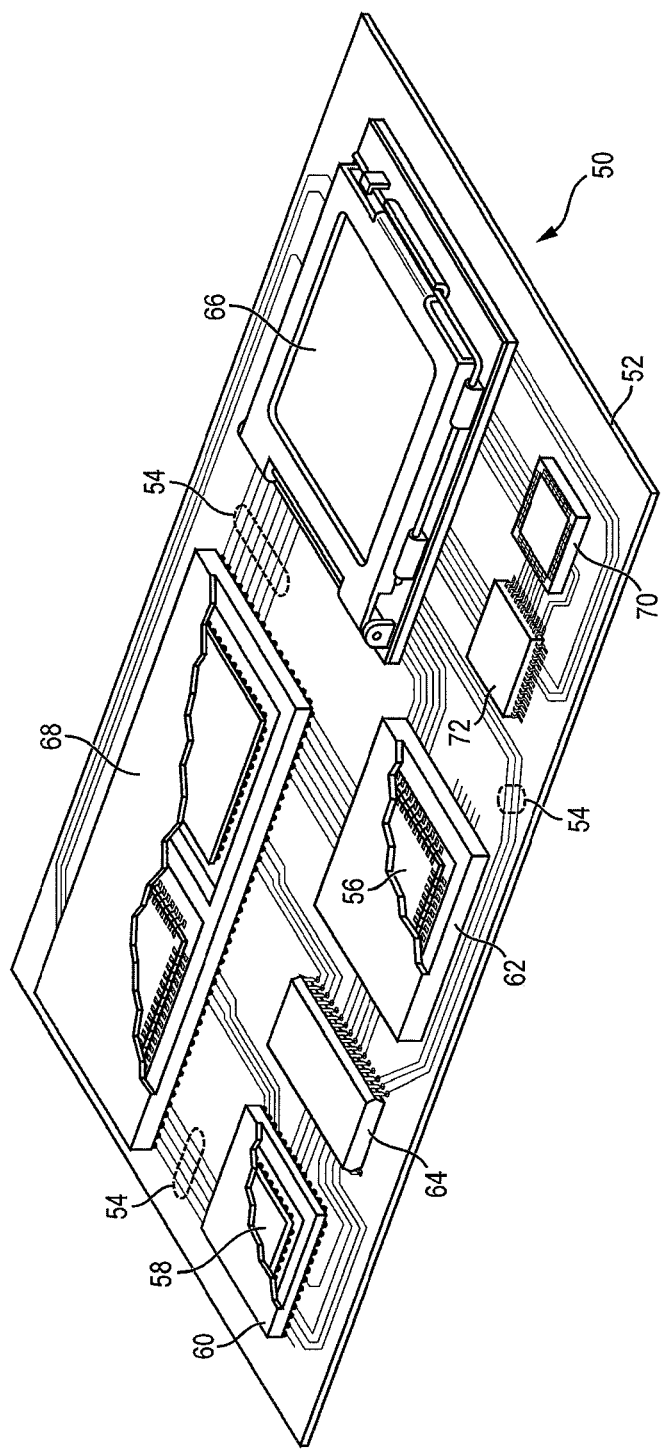
FIG. 2 illustrates a printed circuit board (PCB) with different types of packages mounted to its surface.

FIG. 2 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 2 for purposes of illustration.

Electronic device 50 can be a stand-alone system that uses the semiconductor packages to perform one or more electrical functions. Alternatively, electronic device 50 can be a sub-component of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 2, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 3A:
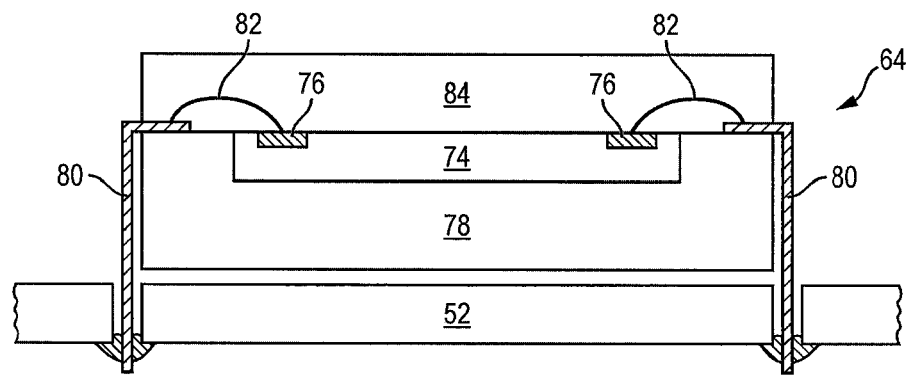
FIGS. 3a-3c illustrate further detail of the representative semiconductor packages mounted to the PCB.
Figure 3B:
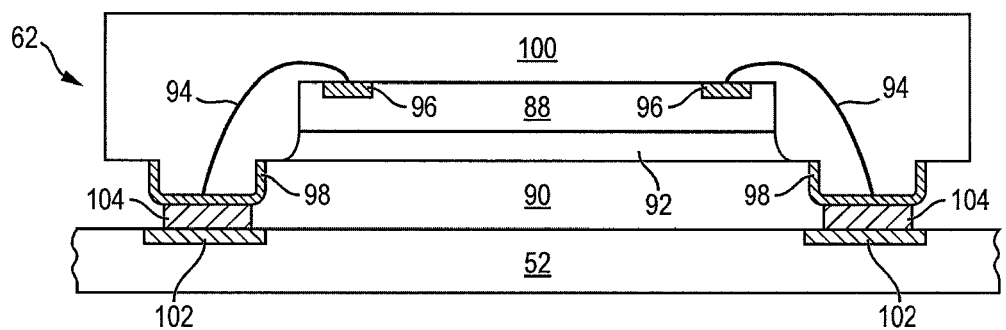
Figure 3C:
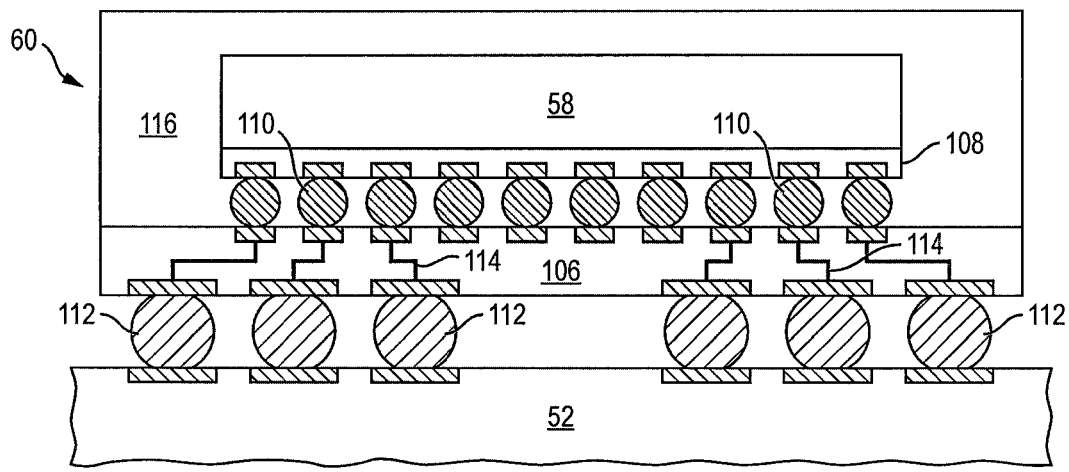

FIGS. 3a-3c show exemplary semiconductor packages. FIG. 3a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 3b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 3c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 4A:
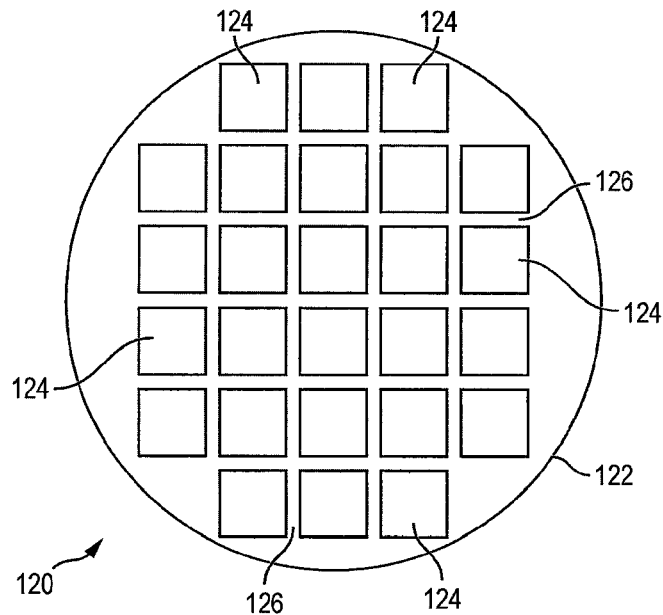
FIGS. 4a-4c illustrate a semiconductor wafer with a plurality of semiconductor die separated by a saw street.

FIG. 4a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

Figure 4B:
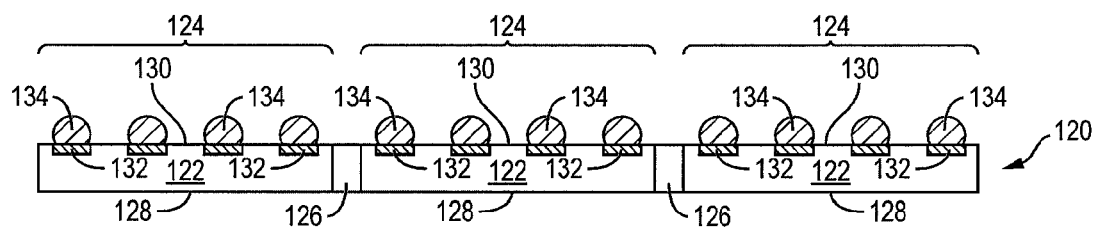

FIG. 4b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. In one embodiment, semiconductor die 124 is a flipchip type device.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Contact pads 132 can be disposed side-by-side a first distance from the edge of semiconductor die 124, as shown in FIG. 4b. Alternatively, contact pads 132 can be offset in multiple rows such that a first row of contact pads is disposed a first distance from the edge of the die, and a second row of contact pads alternating with the first row is disposed a second distance from the edge of the die.

An electrically conductive bump material is deposited over contact pads 132 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to contact pads 132 using a suitable attachment or bonding process. In one embodiment, the bump material is reflowed by heating the material above its melting point to form balls or bumps 134. In some applications, bumps 134 are reflowed a second time to improve electrical contact to contact pads 132. Bumps 134 can also be compression bonded to contact pads 132. Bumps 134 represent one type of interconnect structure that can be formed over contact pads 132. The interconnect structure can also use stud bump, micro bump, or other electrical interconnect.

Figure 4C:
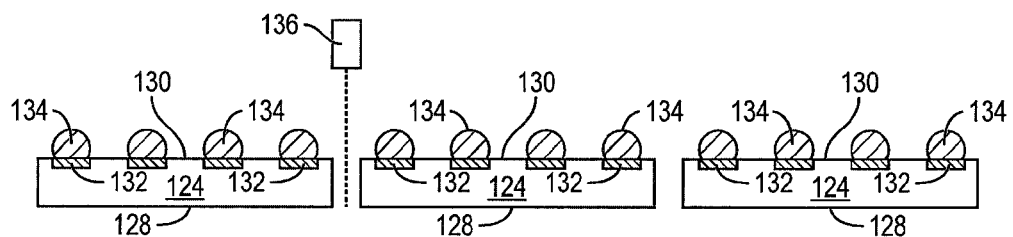

In FIG. 4c, semiconductor wafer 120 is singulated through saw street 126 using a saw blade or laser cutting tool 136 into individual semiconductor die 124.

Figure 5A:
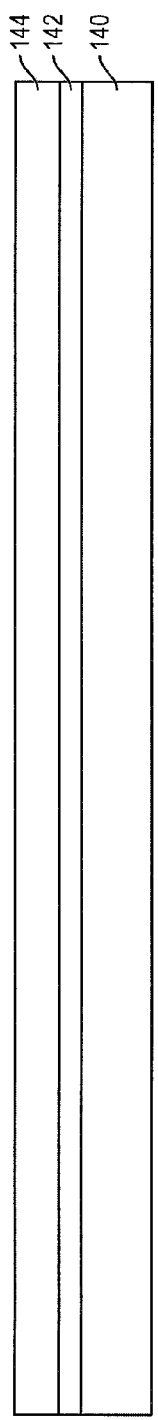
FIGS. 5a-5d illustrate a process of forming a substrate with vertical and horizontal conductive layers.

FIGS. 5a-5d illustrate a process of forming an interposer or substrate for vertical electrical interconnect of a semiconductor die. In FIG. 5a, a substrate or carrier 140 contains temporary or sacrificial base material such as silicon, germanium, gallium arsenide, indium phosphide, silicon carbide, resin, or other suitable low-cost, rigid material for structural support. An interface layer or double-sided tape 142 is formed over carrier 140 as a temporary adhesive bonding film or etch-stop layer. A semiconductor wafer or substrate 144 contains a base material, such as silicon, germanium, gallium arsenide, indium phosphide, or silicon carbide, for structural support. As a semiconductor wafer, substrate 144 can contain embedded semiconductor die or passive devices. Substrate 144 can also be a multi-layer flexible laminate, ceramic, or leadframe. Substrate 144 is mounted to interface layer 142 over carrier 140.

Figure 5B:
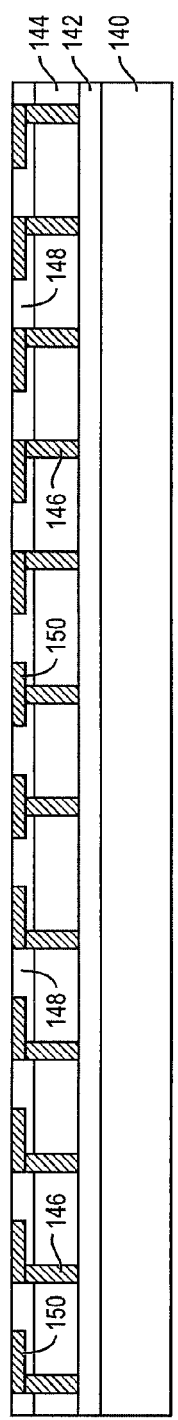

In FIG. 5b, a plurality of vias is formed through substrate 144 using laser drilling, mechanical drilling, or deep reactive ion etching (DRIE). The vias are filled with Al, Cu, Sn, Ni, Au, Ag, titanium (Ti), tungsten (W), poly-silicon, or other suitable electrically conductive material using electrolytic plating, electroless plating process, or other suitable metal deposition process to form z-direction vertical interconnect conductive vias 146.

An insulating or passivation layer 148 is formed over a surface of substrate 144 and conductive vias 146 using PVD, CVD, printing, spin coating, spray coating, sintering or thermal oxidation. The insulating layer 148 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. A portion of insulating layer 148 is removed by an etching process to expose substrate 144 and conductive vias 146.

An electrically conductive layer or RDL 150 is formed over the exposed substrate 144 and conductive vias 146 using a patterning and metal deposition process such as printing, PVD, CVD, sputtering, electrolytic plating, and electroless plating. Conductive layer 150 can be one or more layers of Al, Cu, Sn, Ni, Au, Ag, or other suitable electrically conductive material. Conductive layer 150 is electrically connected to conductive vias 146.

Figure 5C:
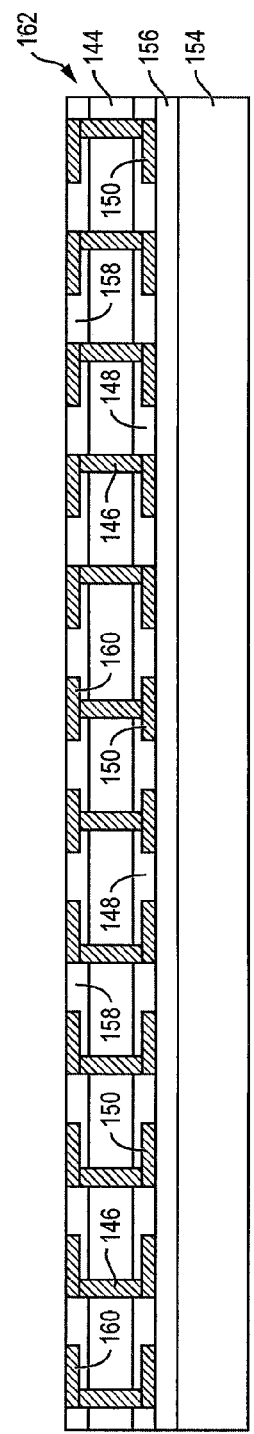

In FIG. 5c, a substrate or carrier 154 contains temporary or sacrificial base material such as silicon, polymer, beryllium oxide, or other suitable low-cost, rigid material for structural support. An interface layer or double-sided tape 156 is formed over carrier 154 as a temporary adhesive bonding film or etch-stop layer. Leading with insulating layer 148 and conductive layer 150, substrate 144 is mounted to interface layer 156 over carrier 154. Carrier 140 and interface layer 142 are removed by chemical etching, mechanical peeling, CMP, mechanical grinding, thermal bake, UV light, laser scanning, or wet stripping to expose a surface of substrate 144 and conductive vias 146 opposite conductive layer 150.

An insulating or passivation layer 158 is formed over substrate 144 and conductive vias 146 using PVD, CVD, printing, spin coating, spray coating, sintering or thermal oxidation. The insulating layer 158 contains one or more layers of SiO2, Si3N4, SiON, Ta2O5, Al2O3, or other material having similar insulating and structural properties. A portion of insulating layer 158 is removed by an etching process to expose substrate 144 and conductive vias 146.

An electrically conductive layer or RDL 160 is formed over the exposed substrate 144 and conductive vias 146 using a patterning and metal deposition process such as printing, PVD, CVD, sputtering, electrolytic plating, and electroless plating. Conductive layer 160 can be one or more layers of Al, Cu, Sn, Ni, Au, Ag, or other suitable electrically conductive material. Conductive layer 160 is electrically connected to conductive vias 146. In another embodiment, conductive vias 146 are formed through substrate 144 after forming conductive layers 150 and/or 160.

Figure 5D:
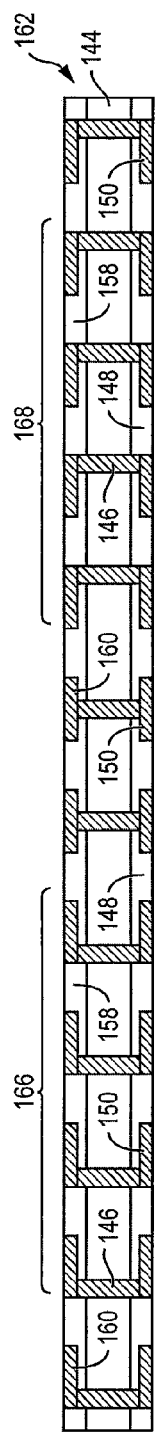

In FIG. 5d, carrier 154 and interface layer 156 are removed by chemical etching, mechanical peeling, CMP, mechanical grinding, thermal bake, UV light, laser scanning, or wet stripping to expose a surface of substrate 144, including insulating layer 148 and conductive layer 160. The interposer or substrate 162 provides electrical interconnect vertically and laterally across the substrate through conductive layers 150 and 160 and conductive vias 146 according to the electrical function of semiconductor die 124. An upper surface of substrate 162 has die attach areas 166 and 168 designated for mounting semiconductor die 124.

Figure 6H:
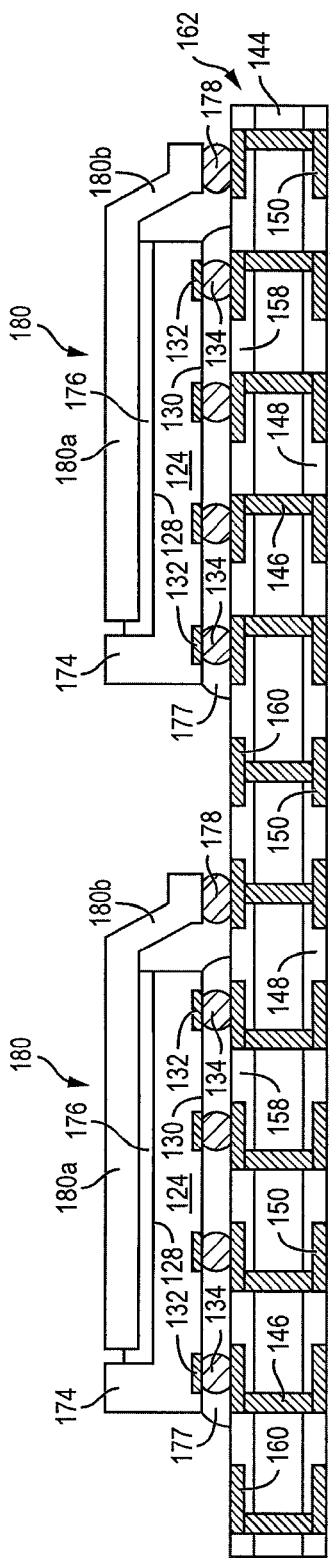

FIGS. 6a-6j illustrate, in relation to FIGS. 2 and 3a-3c, a process of forming a TIM and heat spreader within a recess defined by sidewalls in a back surface of a semiconductor die. In FIG. 6a, semiconductor die 124 from FIGS. 3a-3c are aligned to die attach areas 166 and 168 and mounted to substrate 162 by reflowing bumps 134 to metallurgically and electrically connect the bumps to conductive layer 160. FIG. 6b shows semiconductor die 124 mounted to die attach areas 166 and 168 of substrate 162. Bumps 134 are electrically connected to conductive layers 150 and 160 and conductive vias 146 in accordance with the electrical design and function of semiconductor die 124.

In FIG. 6c, a portion of back surface 128 is removed by an etching process through a patterned photoresist layer (not shown) to form a rectangular recess or slot 170 extending to edge 172 of semiconductor die 124. Alternatively, recess 170 is formed by using laser or saw blade 173. A portion of back surface 128 remains as sidewalls 174 of recess 170 on two sides of semiconductor die 124. In another embodiment, a portion of back surface 128 remains as sidewalls 174 of recess 170 on three sides of semiconductor die 124. The depth of recess 170 can be about 0.5 millimeters (mm). FIG. 6d shows a plan view of recess 170 with sidewalls 174 on two sides of semiconductor die 124.

In FIG. 6e, a thermal interface material (TIM) 176 is deposited within recess 170 defined by sidewalls 174 over back surface 128 of semiconductor die 124. TIM 176 is a thermal epoxy, thermal epoxy resin, or thermal conductive paste. FIG. 6f shows a plan view of TIM 176 deposited within recess 170 defined by sidewalls 174 over back surface 128 of semiconductor die 124.

Semiconductor die 124 and substrate 162 are placed in a chase mold. Mold underfill (MUF) material 177 in a liquid state is injected into the area between semiconductor die 124 and substrate 162 while an optional vacuum assist draws pressure from the opposite side. MUF material 177 can be an encapsulant, molding compound, or polymer composite material, such as epoxy resin with filler, epoxy acrylate with filler, or polymer with proper filler. FIG. 6e shows MUF material 177 disposed between semiconductor die 124 and substrate 162.

In FIG. 6g, a conductive paste 178 is deposited over conductive layer 160. Heat spreader or heat sink 180 is positioned over and mounted to TIM 176 within recess 170 defined by sidewalls 174 over back surface 128 of semiconductor die 124. Heat spreader 180 can be Cu, Al, or other material with high thermal conductivity. Heat spreader 180 has a horizontal portion 180a contacting TIM 176 and down leg portion 180b extending vertical from horizontal portion 180a and contacting conductive paste 178. FIG. 6h shows heat spreader 180 mounted to TIM 176 within recess 170 defined by sidewalls 174 over back surface 128 of semiconductor die 124.

Figure 6I:
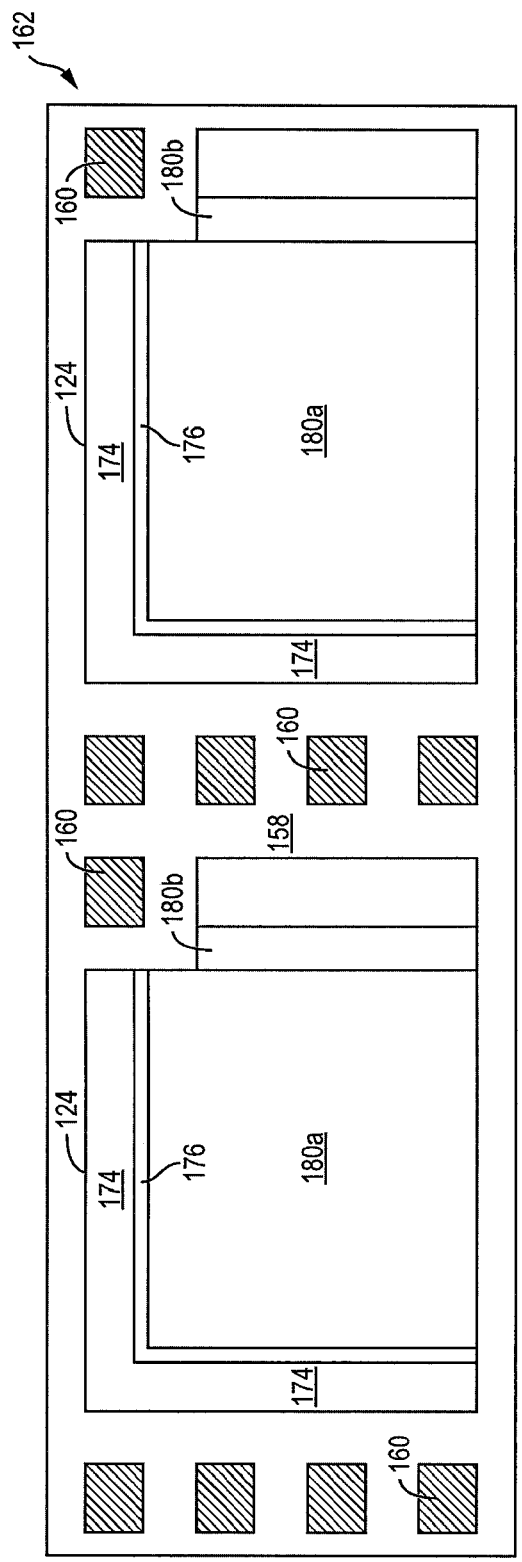

Heat spreader 180 is mounted onto TIM 176 under pressure. TIM 176 is compressed and excess TIM is pressed up sidewalls 174 when mounting heat spreader 180. The sidewalls 174 of recess 170 prevent a spreading out of TIM 176 and maintain a uniform distribution of TIM 176 under heat spreader 180 without forming voids in the TIM. The absence of sidewalls on one or two sides of semiconductor die 124 provides a convenient and cost effective configuration and access for down leg portion 180b to route heat away from semiconductor die 124 to conductive paste 178 and conductive layer 160. The down leg portion 180b can extend directly vertical from horizontal portion 180a of heat spreader 180 without routing the down leg portion over a sidewall of recess 170. Heat spreader 180 and TIM 176 form a thermally conductive path that distributes and dissipates the heat generated by the high frequency electronic components of semiconductor die 124 and increases the thermal performance of the semiconductor package. The heat is dissipated away semiconductor die 124 through horizontal portion 180a and down leg portion 180b of heat spreader 180 to conductive paste 178 and conductive layer 160. FIG. 6i shows a plan view of heat spreader 180 mounted to TIM 176 within recess 170 defined by sidewalls 174 over back surface 128 of semiconductor die 124.

With TIM 176 contained within recess 170 defined by sidewalls 174, the TIM remains in place with its design thickness over back surface 128 of semiconductor die 124 for efficient thermal conduction. TIM 176 contained within recess 170 defined by sidewalls 174 avoids a spreading out or pump-out of the TIM during formation of heat spreader 180, as well as during power cycling and other conditions of thermal mechanical stress on the semiconductor package.

Figure 6J:
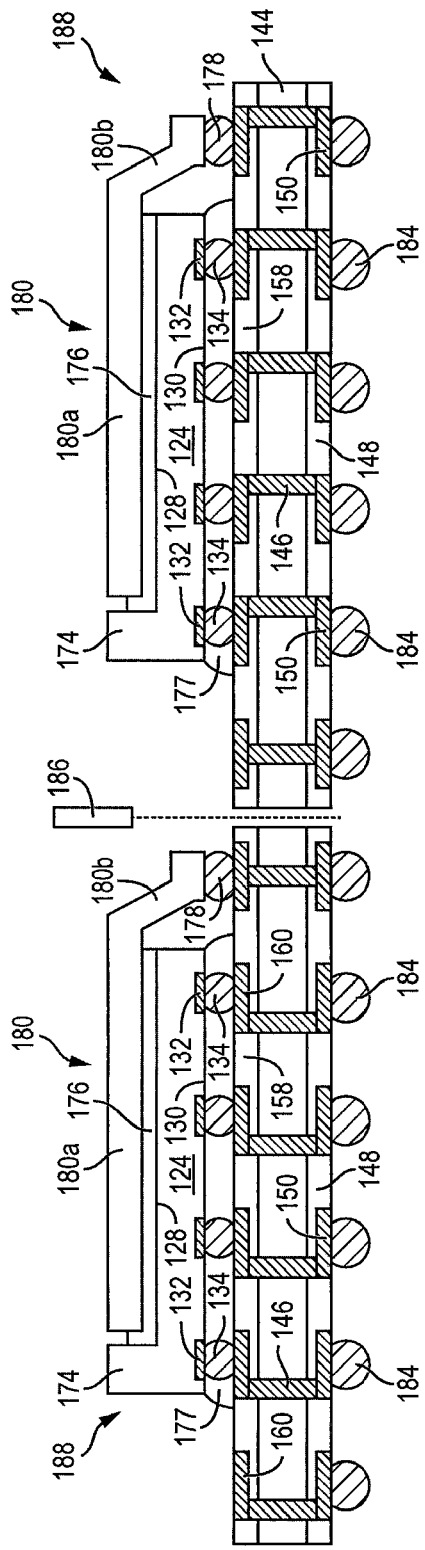

In FIG. 6j, an electrically conductive bump material is deposited over conductive layer 150 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 150 using a suitable attachment or bonding process. In one embodiment, the bump material is reflowed by heating the material above its melting point to form balls or bumps 184. In some applications, bumps 184 are reflowed a second time to improve electrical contact to conductive layer 150. Bumps 184 can also be compression bonded to conductive layer 150. An optional under bump metallization (UBM) layer can be formed over conductive layer 150. Bumps 184 represent one type of interconnect structure that can be formed over conductive layer 150. The interconnect structure can also use stud bump, micro bump, or other electrical interconnect.

The assembly is singulated through substrate 162 with saw blade or laser cutting tool 186 into individual semiconductor package 188.

Figure 7:
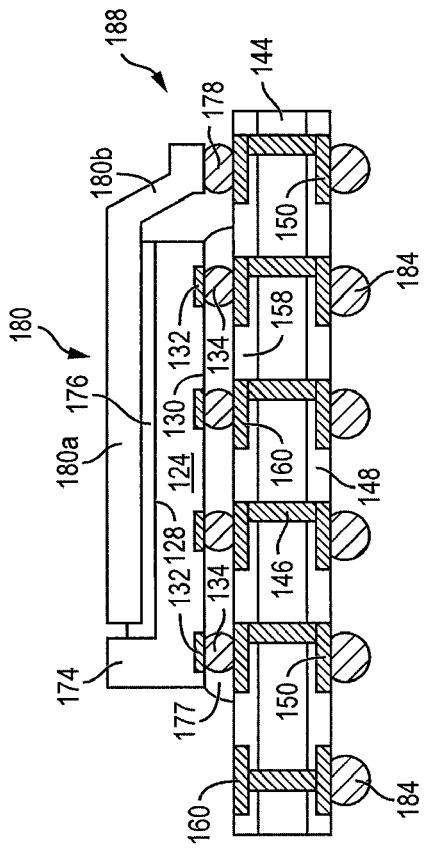
FIG. 7 illustrates the TIM and heat spreader formed within the recess defined by sidewalls in the back surface of the semiconductor die according to FIGS. 6a-6j.

FIG. 7 shows semiconductor package 188 after singulation. Semiconductor die 124 is electrically connected to substrate 162 with bumps 134. Heat spreader 180 and TIM 176 form a thermally conductive path that distributes and dissipates the heat generated by the high frequency electronic components of semiconductor die 124 and increases the thermal performance of semiconductor package 188. The sidewalls 174 of recess 170 contain TIM 176 and prevent a spreading out of TIM 176 to maintain a uniform distribution under heat spreader 180 without forming voids in the TIM. The absence of sidewalls on one or two sides of semiconductor die 124 provides a convenient and cost effective access for down leg portion 180b to route heat away from semiconductor die 124 to conductive paste 178 and conductive layer 160. The down leg portion 180b can extend directly vertical from horizontal portion 180a of heat spreader 180 without routing the down leg portion over a sidewall of recess 170.

With TIM 176 contained within recess 170 defined by sidewalls 174, the TIM remains in place with its design thickness over back surface 128 of semiconductor die 124 for efficient thermal conduction. TIM 176 contained within recess 170 defined by sidewalls 174 avoids a spreading out or pump-out of the TIM during formation of heat spreader 180, as well as during power cycling and other conditions of thermal mechanical stress on the semiconductor package. The design thickness of TIM 176 is maintained following formation of heat spreader 180 to improve heat dissipation and reduce warpage of semiconductor package 188.

Figure 8C:
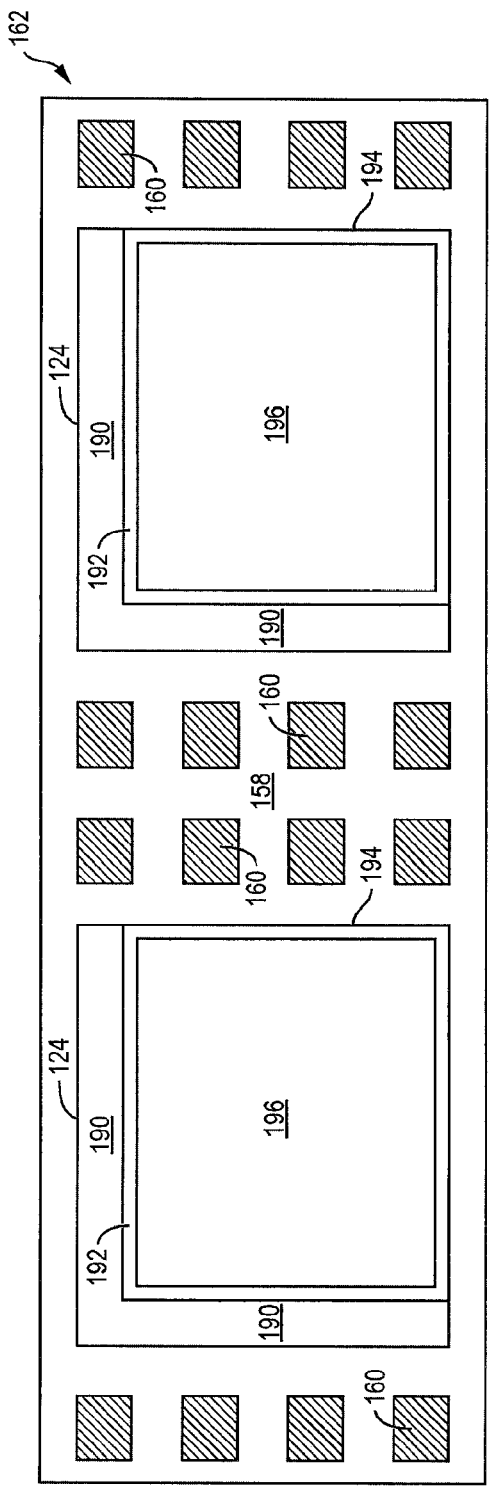

FIGS. 8a-8f illustrate, in relation to FIGS. 2 and 3a-3c, a process of forming a TIM and heat spreader within a recess defined by a barrier layer over a back surface of a semiconductor die. A portion of back surface 128 can be removed by a grinder to reduce the thickness of semiconductor die 124 while in wafer form, see FIGS. 4a-4b. Continuing from FIG. 6b, a barrier layer 190 is formed over two sides of semiconductor die 124, as shown in FIG. 8a. No barrier layer is formed on the remaining sides of semiconductor die 124. Barrier layer 190 can be metal or insulating material, such as one or more layers of SiO2, Si3N4, SiON, Ta2O5, Al2O3, hafnium oxide (HfO2), polyimide, benzocyclobutene (BCB), polybenzoxazoles (PBO), epoxy, or polymer material. Barrier layer 190 has a height of about 0.5 mm to form a recess or slot 192 over back surface 128 extending to edge 194 of semiconductor die 124. In another embodiment, barrier layer 190 is formed on three sides of semiconductor die 124. No barrier layer is formed on the fourth side of semiconductor die 124.

In FIG. 8b, a TIM 196 is deposited into recess 192 defined by barrier layer 190 over back surface 128 of semiconductor die 124. TIM 196 is a thermal epoxy, thermal epoxy resin, or thermal conductive paste. FIG. 8c shows a plan view of TIM 196 deposited into recess 192 defined by barrier layer 190 over back surface 128 of semiconductor die 124.

Semiconductor die 124 and substrate 162 are placed in a chase mold. MUF material 197 in a liquid state is injected into the area between semiconductor die 124 and substrate 162 while an optional vacuum assist draws pressure from the opposite side. MUF material 197 can be an encapsulant, molding compound, or polymer composite material, such as epoxy resin with filler, epoxy acrylate with filler, or polymer with proper filler. FIG. 8b shows MUF material 197 disposed between semiconductor die 124 and substrate 162.

Figure 8D:
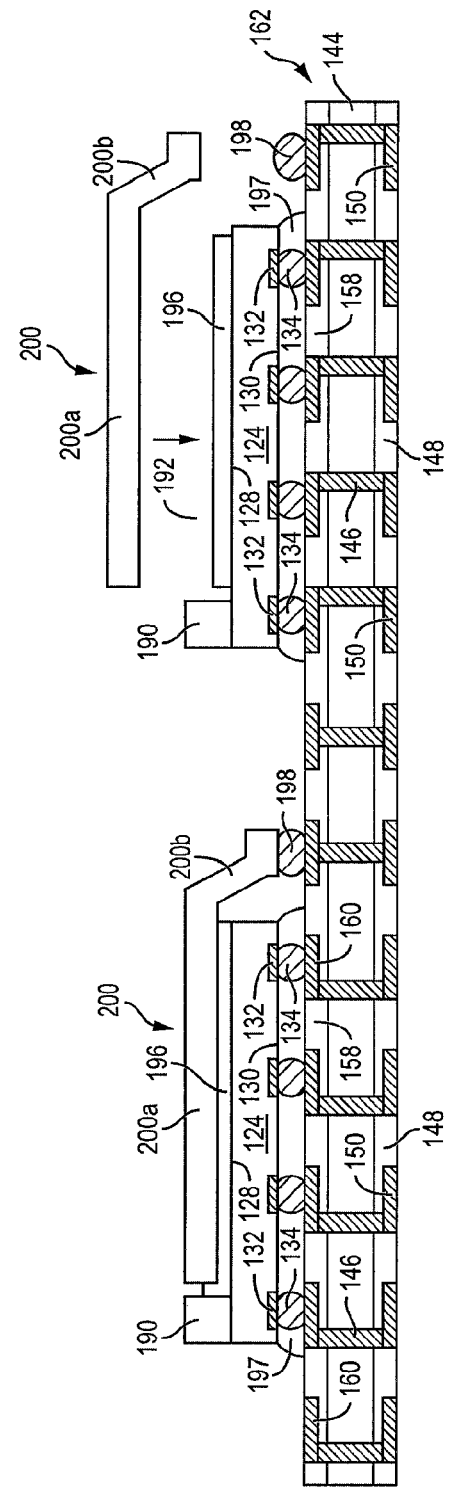

In FIG. 8d, a conductive paste 198 is deposited over conductive layer 160. Heat spreader or heat sink 200 is positioned over and mounted to TIM 196 within recess 192 defined by barrier layer 190 over back surface 128 of semiconductor die 124. Heat spreader 200 can be Cu, Al, or other material with high thermal conductivity. Heat spreader 200 has a horizontal portion 200a contacting TIM 196 and down leg portion 200b extending vertical from horizontal portion 200a and contacting conductive paste 198. FIG. 8e shows heat spreader 200 mounted to TIM 196 within recess 192 defined by barrier layer 190 over back surface 128 of semiconductor die 124.

Heat spreader 200 is mounted onto TIM 196 under pressure. TIM 196 is compressed and excess TIM is pressed up barrier layer 190 when mounting heat spreader 200. The barrier layer 190 of recess 192 contains TIM 196 and prevents a spreading out of TIM 196 to maintain a uniform distribution under heat spreader 200 without forming voids in the TIM. The absence of a barrier layer on one or two sides of semiconductor die 124 provides a convenient and cost effective configuration and access for down leg portion 200b to route heat away from semiconductor die 124 to conductive paste 198 and conductive layer 160. The down leg portion can extend directly vertical from horizontal portion 200a of heat spreader 200 without routing the down leg portion over a barrier layer of recess 192. Heat spreader 200 and TIM 196 form a thermally conductive path that distributes and dissipates the heat generated by the high frequency electronic components of semiconductor die 124 and increases the thermal performance of the semiconductor package. The heat is dissipated away semiconductor die 124 through horizontal portion 200*a* and down leg portion 200*b* of heat spreader 200 to conductive paste 198 and conductive layer 160. FIG. 8*f* shows a plan view of heat spreader 200 mounted to TIM 196 within recess 192 defined by barrier layer 190 over back surface 128 of semiconductor die 124.

With TIM 196 contained within recess 192 defined by barrier layer 190, the TIM remains in place with its design thickness over back surface 128 of semiconductor die 124 for efficient thermal conduction. TIM 196 contained within recess 192 defined by barrier layer 190 avoids a spreading out or pump-out of the TIM during formation of heat spreader 200, as well as during power cycling and other conditions of thermal mechanical stress on the semiconductor package.

Returning to FIG. 8*e*, an electrically conductive bump material is deposited over conductive layer 150 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 150 using a suitable attachment or bonding process. In one embodiment, the bump material is reflowed by heating the material above its melting point to form balls or bumps 204. In some applications, bumps 204 are reflowed a second time to improve electrical contact to conductive layer 150. Bumps 204 can also be compression bonded to conductive layer 150. An optional UBM layer can be formed over conductive layer 150. Bumps 204 represent one type of interconnect structure that can be formed over conductive layer 150. The interconnect structure can also use stud bump, micro bump, or other electrical interconnect.

The assembly is singulated through substrate 162 with saw blade or laser cutting tool 206 into individual semiconductor package 208.

Figure 9:
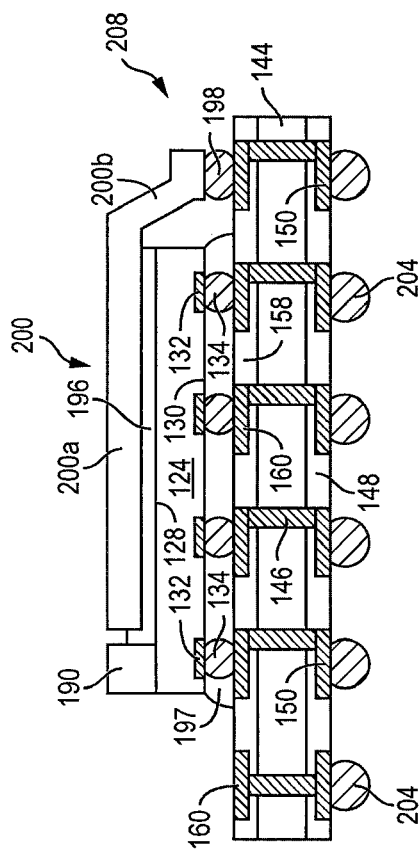
FIG. 9 illustrates the TIM and heat spreader formed within the recess defined by the barrier layer over the back surface of the semiconductor die according to FIGS. 8a-8f.

FIG. 9 shows semiconductor package 208 after singulation. Semiconductor die 124 is electrically connected to substrate 162 with bumps 134. Heat spreader 200 and TIM 196 form a thermally conductive path that distributes and dissipates the heat generated by the high frequency electronic components of semiconductor die 124 and increases the thermal performance of semiconductor package 208. The barrier layer 190 of recess 192 contain TIM 196 and prevent a spreading out of TIM 196 to maintain a uniform distribution under heat spreader 200 without forming voids in the TIM. The absence of a barrier layer on one or two sides of semiconductor die 124 provides a convenient and cost effective access for down leg portion 200*b* to route heat away from semiconductor die 124 to conductive paste 198 and conductive layer 160. The down leg portion 200*b* can extend directly vertical from horizontal portion 200*a* of heat spreader 200 without routing the down leg portion over a barrier layer of recess 192.

Figure 10A:
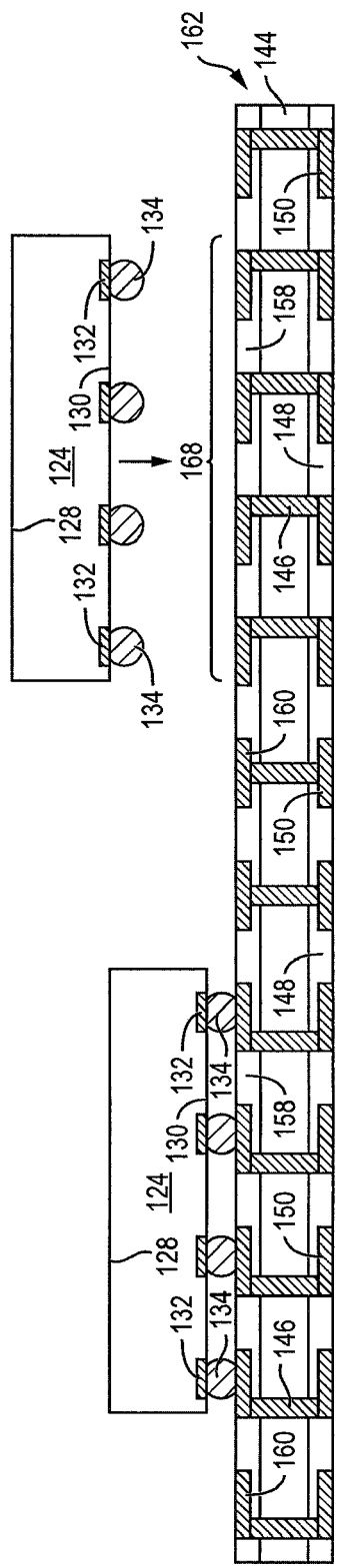
Figure 10B:
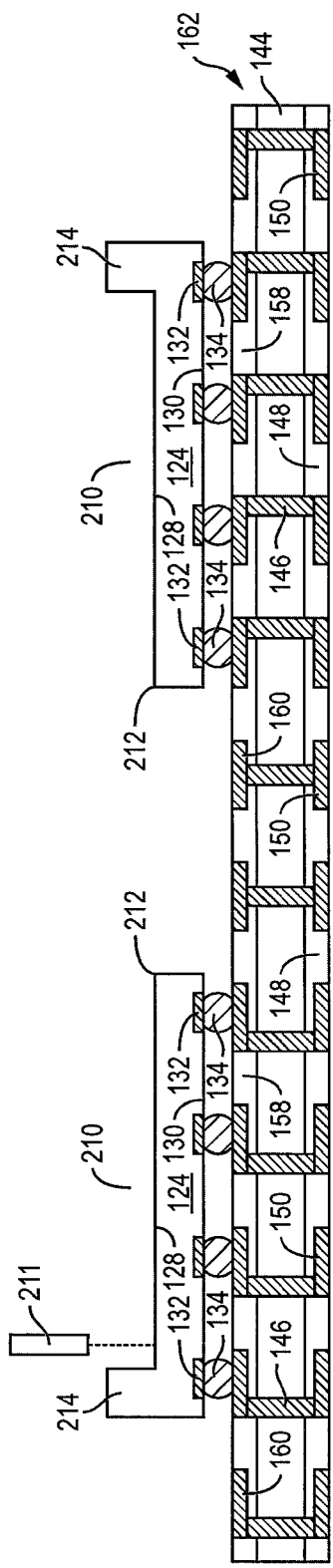

FIGS. 10*a*-10*g* illustrate, in relation to FIGS. 2 and 3*a*-3*c*, a process of forming a TIM and heat spreader within a recess defined by sidewalls in a back surface of adjacent semiconductor die. In FIG. 10*a*, semiconductor die 124 from FIGS. 3*a*-3*c* are aligned to die attach areas 166 and 168 and mounted to substrate 162 by reflowing bumps 134 to metallurgically and electrically connect the bumps to conductive layer 160. FIG. 10*b* shows semiconductor die 124 mounted to die attach areas 166 and 168 of substrate 162. Bumps 134 are electrically connected to conductive layers 150 and 160 and conductive vias 146 in accordance with the electrical design and function of semiconductor die 124.

A portion of back surface 128 is removed by an etching process through a patterned photoresist layer to form a rectangular recess or slot 210 extending to edge 212 of semiconductor die 124. Alternatively, recess 210 is formed by laser or saw blade 211. A portion of back surface 128 remains as sidewalls 214 of recess 210 on two sides of semiconductor die 124. In another embodiment, a portion of back surface 128 remains as sidewalls 214 of recess 210 on three sides of semiconductor die 124. The depth of recess 210 can be about 0.5 mm.

Figure 10C:
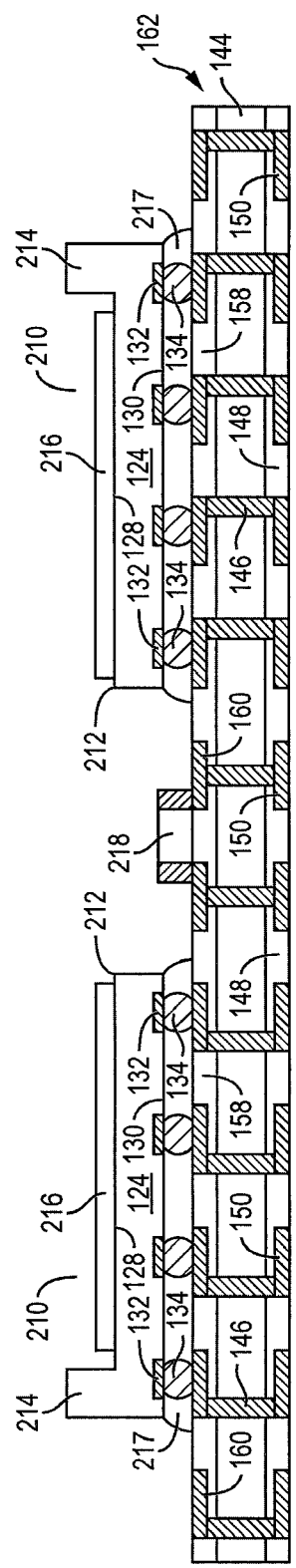
Figure 10D:
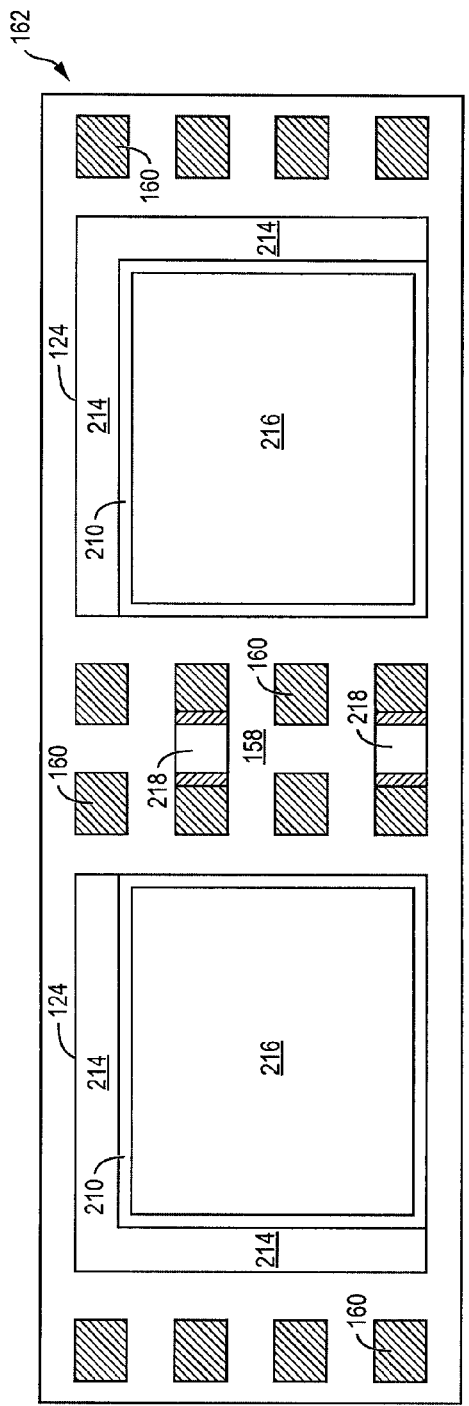

In FIG. 10*c*, a TIM 216 is deposited into recess 210 defined by sidewalls 214 over back surface 128 of semiconductor die 124. TIM 216 is a thermal epoxy, thermal epoxy resin, or thermal conductive paste. A discrete electrical device 218, such as an inductor, capacitor, resistor, transistor, or diode, is mounted to substrate 162 and electrically connected to conductive layer 160. FIG. 10*d* shows a plan view of TIM 216 deposited into recess 210 defined by sidewalls 214 over back surface 128 of semiconductor die 124.

Semiconductor die 124 and substrate 162 are placed in a chase mold. MUF material 217 in a liquid state is injected into the area between semiconductor die 124 and substrate 162 while an optional vacuum assist draws pressure from the opposite side. MUF material 217 can be an encapsulant, molding compound, or polymer composite material, such as epoxy resin with filler, epoxy acrylate with filler, or polymer with proper filler. FIG. 10*c* shows MUF material 217 disposed between semiconductor die 124 and substrate 162.

Figure 10E:
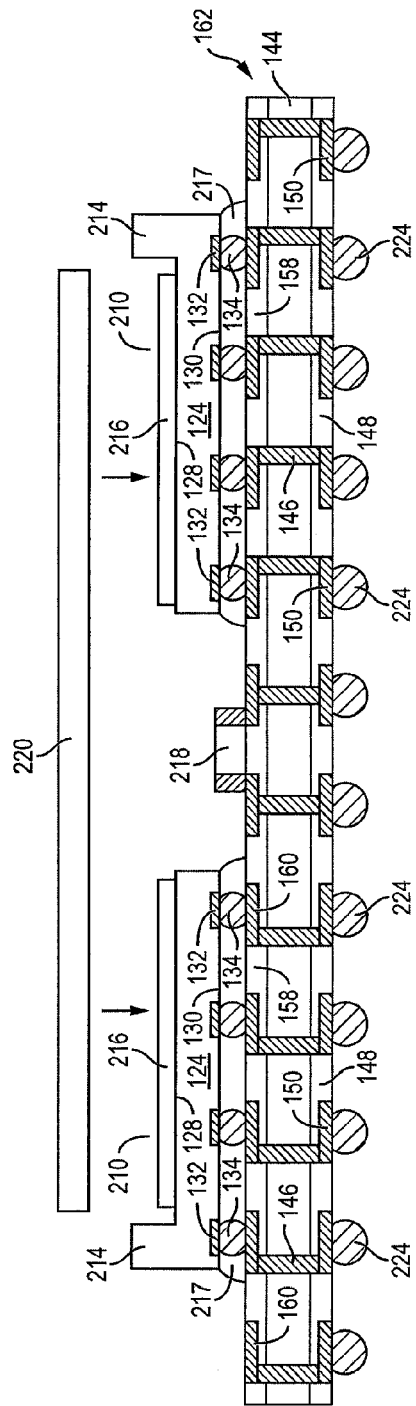

In FIG. 10*e*, heat spreader or heat sink 220 is positioned over and mounted to TIM 216 within recess 210 defined by sidewalls 214 over back surface 128 of adjacent semiconductor die 124. Heat spreader 220 can be Cu, Al, or other material with high thermal conductivity. FIG. 10*f* shows heat spreader 220 mounted to TIM 216 within recess 210 defined by sidewalls 214 over back surface 128 of adjacent semiconductor die 124. Heat spreader 220 extends across adjacent semiconductor die 124 for mounted to TIM 216 within recess 210 defined by sidewalls 214 over back surface 128 of the adjacent semiconductor die.

Heat spreader 220 is mounted onto TIM 216 under pressure. TIM 216 is compressed and excess TIM is pressed up sidewalls 214 when mounting heat spreader 220. The sidewalls 214 of recess 210 prevent a spreading out of TIM 216 and maintain a uniform distribution of TIM 216 under heat spreader 220 without forming voids in the TIM. The absence of sidewalls on one or two sides of semiconductor die 124 provides a convenient and cost effective configuration for heat spreader 220 to extend across adjacent semiconductor die 124 and be mounted to TIM 216 within recess 210 defined by sidewalls 214 over back surface 128 of the adjacent semiconductor die. Heat spreader 220 and TIM 216 form a thermally conductive path that distributes and dissipates the heat generated by the high frequency electronic components of semiconductor die 124 and increases the thermal performance of the semiconductor package. The heat is radially dissipated away semiconductor die 124. FIG. 10*g* shows a plan view of heat spreader 220 mounted to TIM 216 within recess 210 defined by sidewalls 214 over back surface 128 of adjacent semiconductor die 124.

With TIM 216 contained within recess 210 defined by sidewalls 214, the TIM remains in place with its design thickness over back surface 128 of semiconductor die 124 for efficient thermal conduction. TIM 216 contained within recess 210 defined by sidewalls 214 avoids a spreading out or pump-out of the TIM during formation of heat spreader 220, as well as during power cycling and other conditions of thermal mechanical stress on the semiconductor package.

Returning to FIG. 10f, an electrically conductive bump material is deposited over conductive layer 150 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 150 using a suitable attachment or bonding process. In one embodiment, the bump material is reflowed by heating the material above its melting point to form balls or bumps 224. In some applications, bumps 224 are reflowed a second time to improve electrical contact to conductive layer 150. Bumps 224 can also be compression bonded to conductive layer 150. An optional UBM layer can be formed over conductive layer 150. Bumps 224 represent one type of interconnect structure that can be formed over conductive layer 150. The interconnect structure can also use stud bump, micro bump, or other electrical interconnect.

Figure 11A:
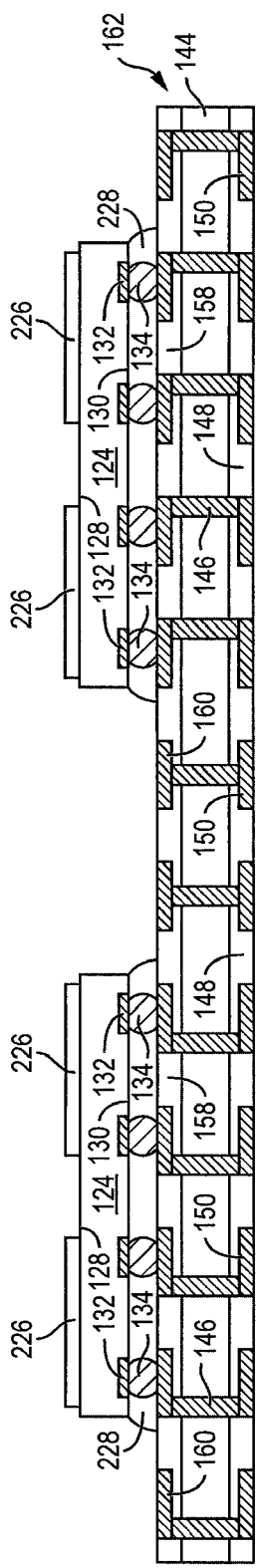
Figure 11B:
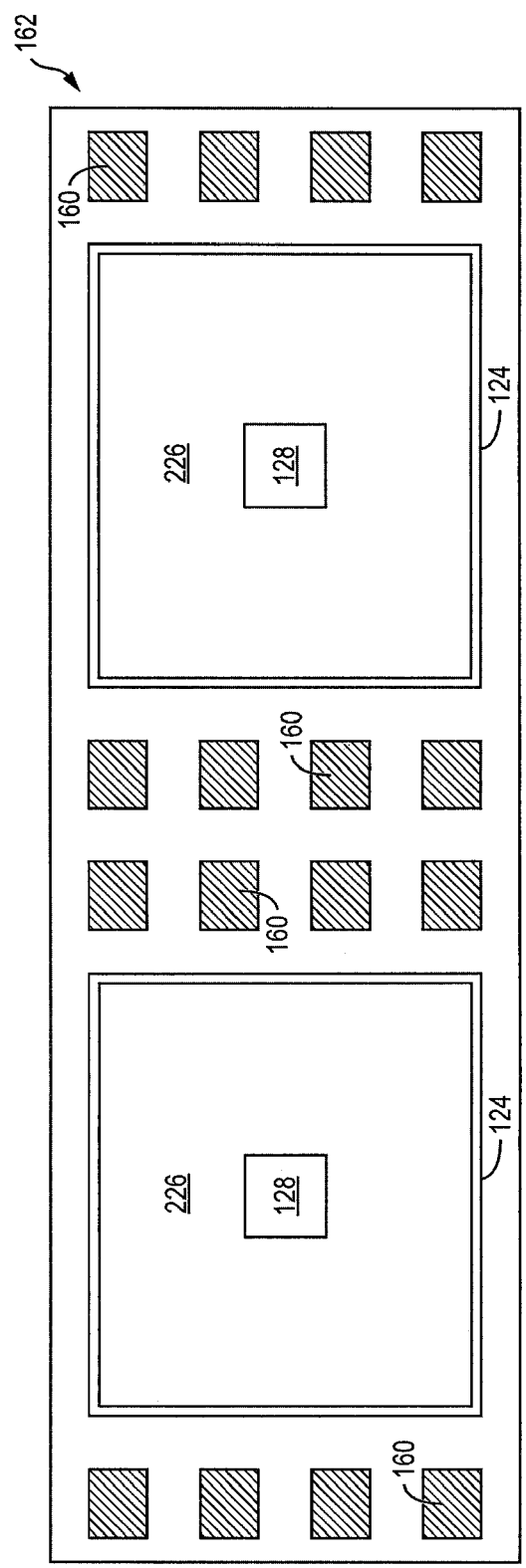

FIGS. 11a-11f illustrate, in relation to FIGS. 2 and 3a-3c, a process of forming a TIM and heat spreader over a back surface of a semiconductor die. Continuing from FIG. 6b, a TIM 226 is deposited over back surface 128 of semiconductor die 124, as shown in FIGS. 11a-11b. TIM 226 is a thermal epoxy, thermal epoxy resin, or thermal conductive paste. FIG. 11b shows a plan view of TIM 226 deposited over back surface 128 of semiconductor die 124.

Semiconductor die 124 and substrate 162 are placed in a chase mold. MUF material 228 in a liquid state is injected into the area between semiconductor die 124 and substrate 162 while an optional vacuum assist draws pressure from the opposite side. MUF material 228 can be an encapsulant, molding compound, or polymer composite material, such as epoxy resin with filler, epoxy acrylate with filler, or polymer with proper filler. FIG. 11a shows MUF material 228 disposed between semiconductor die 124 and substrate 162.

In FIG. 11c, a conductive paste 229 is deposited over conductive layer 160. Heat spreader or heat sink 230 is positioned over and mounted to TIM 226 over back surface 128 of semiconductor die 124. Heat spreader 230 can be Cu, Al, or other material with high thermal conductivity. Heat spreader 230 has a horizontal portion 230a contacting TIM 226 and down leg portion 230b extending vertical from horizontal portion 230a and contacting conductive paste 229. The horizontal portion 230a of heat spreader 230 has a central opening 232. FIG. 11d shows heat spreader 230 mounted to TIM 226 over back surface 128 of semiconductor die 124.

Heat spreader 230 is mounted onto TIM 226 under pressure. TIM 226 is compressed and excess TIM is pressed up through central opening 232 of heat spreader 230 when mounting the heat spreader. The central opening 232 maintains a uniform distribution of TIM 226 under heat spreader 230 without forming voids in the TIM. The down leg portion 230b can extend directly vertical from horizontal portion 230a of heat spreader 230. Heat spreader 230 and TIM 226 form a thermally conductive path that distributes and dissipates the heat generated by the high frequency electronic components of semiconductor die 124 and increases the thermal performance of the semiconductor package. The heat is dissipated away semiconductor die 124 through horizontal portions 230a and down leg portion 230b of heat spreader 230 to conductive paste 229 and conductive layer 160. FIG. 11e shows a plan view of heat spreader 230 mounted to TIM 226 over back surface 128 of semiconductor die 124.

In FIG. 11f, an electrically conductive bump material is deposited over conductive layer 150 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 150 using a suitable attachment or bonding process. In one embodiment, the bump material is reflowed by heating the material above its melting point to form balls or bumps 234. In some applications, bumps 234 are reflowed a second time to improve electrical contact to conductive layer 150. Bumps 234 can also be compression bonded to conductive layer 150. An optional UBM layer can be formed over conductive layer 150. Bumps 234 represent one type of interconnect structure that can be formed over conductive layer 150. The interconnect structure can also use stud bump, micro bump, or other electrical interconnect.

The assembly is singulated through substrate 162 with saw blade or laser cutting tool 236 into individual semiconductor package 238.

FIG. 12 shows semiconductor package 238 after singulation. Semiconductor die 124 is electrically connected to substrate 162 with bumps 134. Heat spreader 230 and TIM 226 form a thermally conductive path that distributes and dissipates the heat generated by the high frequency electronic components of semiconductor die 124 and increases the thermal performance of semiconductor package 238. The central opening 232 of heat spreader 230 maintains a uniform distribution under heat spreader 230 without forming voids in the TIM.

Figure 13E:
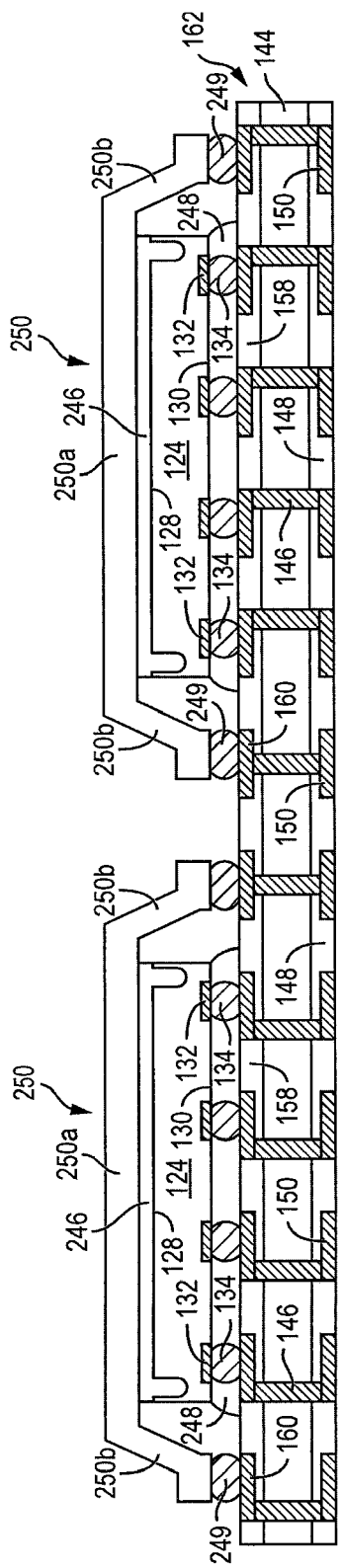

FIGS. 13a-13f illustrate, in relation to FIGS. 2 and 3a-3c, another process of forming a TIM and heat spreader over a back surface of a semiconductor die. Continuing from FIG. 6b, a channel 240 is formed in back surface 128 of semiconductor die 124, as shown in FIG. 13a. Channel 240 can be formed by an etching process through a patterned photoresist layer. Alternatively, channel 240 is formed by laser direct ablation (LDA) using laser 242. Channel 240 can extend along one or more sides of semiconductor die 124, or completely around a perimeter of the semiconductor die.

In FIG. 13b, TIM 246 is deposited over back surface 128 of semiconductor die 124. TIM 246 is a thermal epoxy, thermal epoxy resin, or thermal conductive paste. FIG. 13c shows a plan view of channel 240 formed completely around a perimeter of semiconductor die 124 and TIM 246 deposited over back surface 128 of the semiconductor die.

Semiconductor die 124 and substrate 162 are placed in a chase mold. MUF material 248 in a liquid state is injected into the area between semiconductor die 124 and substrate 162 while an optional vacuum assist draws pressure from the opposite side. MUF material 248 can be an encapsulant, molding compound, or polymer composite material, such as epoxy resin with filler, epoxy acrylate with filler, or polymer with proper filler. FIG. 13b shows MUF material 248 disposed between semiconductor die 124 and substrate 162.

In FIG. 13d, a conductive paste 249 is deposited over conductive layer 160. Heat spreader or heat sink 250 is positioned over and mounted to TIM 246 over back surface 128 of semiconductor die 124. Heat spreader 250 can be Cu, Al, or other material with high thermal conductivity. Heat spreader 250 has a horizontal portion 250a contacting TIM 246 and down leg portion 250b extending vertical from horizontal portion 250a and contacting conductive paste 249. FIG. 13e shows heat spreader 250 mounted to TIM 246 over back surface 128 of semiconductor die 124.

Figure 13F:
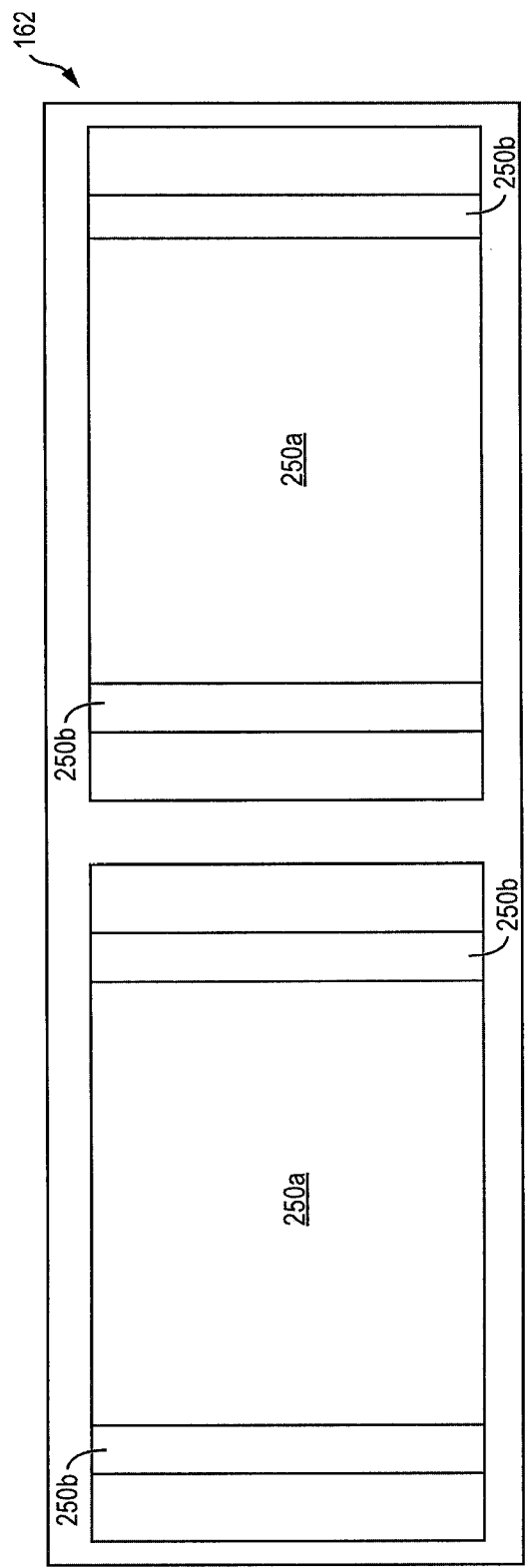

Heat spreader 250 is mounted onto TIM 246 under pressure. TIM 246 is compressed and excess TIM is routed into channels 240 to prevent a spreading out of TIM 246 and maintain a uniform distribution of TIM 246 under heat spreader 250 without forming voids in the TIM. The down leg portion 250b can extend directly vertical from horizontal portion 250a of heat spreader 250. Heat spreader 250 and TIM 246 form a thermally conductive path that distributes and dissipates the heat generated by the high frequency electronic components of semiconductor die 124 and increases the thermal performance of the semiconductor package. The heat is dissipated away semiconductor die 124 through horizontal portion 250a and down leg portion 250b of heat spreader 250 to conductive paste 249 and conductive layer 160. FIG. 13f shows a plan view of heat spreader 250 mounted to TIM 246 over back surface 128 of semiconductor die 124.

Figure 13G:
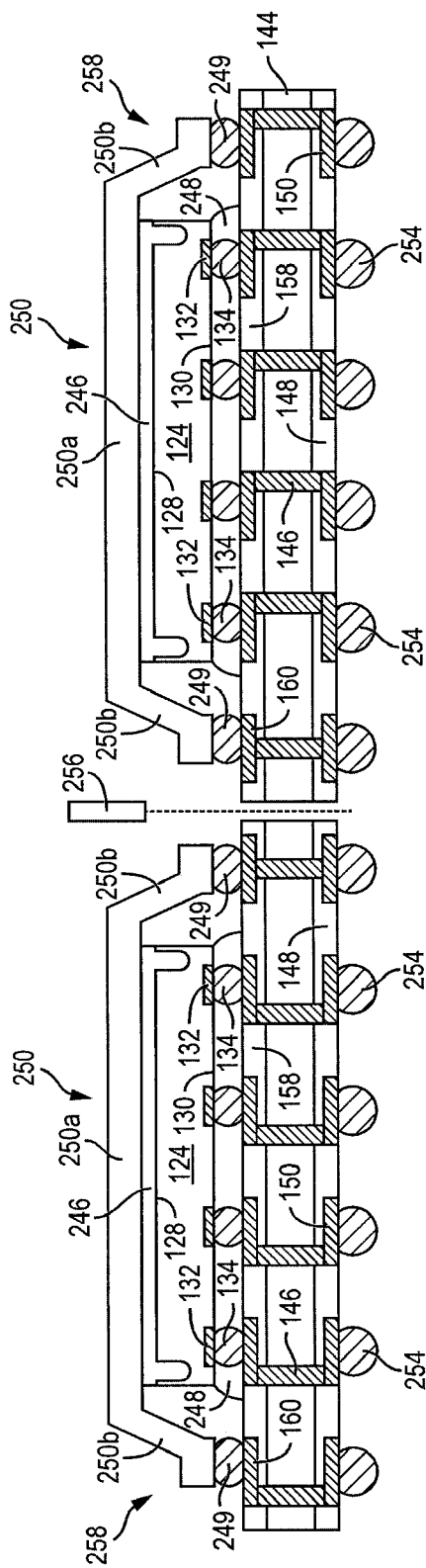

In FIG. 13g, an electrically conductive bump material is deposited over conductive layer 150 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 150 using a suitable attachment or bonding process. In one embodiment, the bump material is reflowed by heating the material above its melting point to form balls or bumps 254. In some applications, bumps 254 are reflowed a second time to improve electrical contact to conductive layer 150. Bumps 254 can also be compression bonded to conductive layer 150. An optional UBM layer can be formed over conductive layer 150. Bumps 254 represent one type of interconnect structure that can be formed over conductive layer 150. The interconnect structure can also use stud bump, micro bump, or other electrical interconnect.

The assembly is singulated through substrate 162 with saw blade or laser cutting tool 256 into individual semiconductor package 258.

Figure 14:
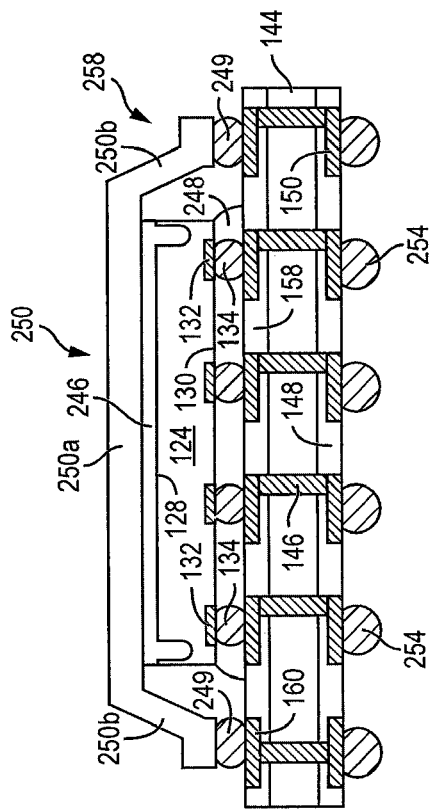
FIG. 14 illustrates the TIM and heat spreader formed over the back surface of the semiconductor die according to FIGS. 13a-13g.

FIG. 14 shows semiconductor package 258 after singulation. Semiconductor die 124 is electrically connected to substrate 162 with bumps 134. Heat spreader 250 and TIM 246 form a thermally conductive path that distributes and dissipates the heat generated by the high frequency electronic components of semiconductor die 124 and increases the thermal performance of semiconductor package 258. Excess TIM 246 is routed into channel 240 to prevent a spreading out of TIM 246 and maintain a uniform distribution under heat spreader 250 without forming voids in the TIM.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a substrate;
   disposing a semiconductor die over the substrate;
   forming a recess over a back surface of the semiconductor die to an edge of the semiconductor die with sidewalls of the recess on at least two sides of the semiconductor die;
   forming a thermal interface material in the recess; and
   disposing a heat spreader in the recess.

2. The method of claim 1, wherein a down leg portion of the heat spreader is thermally connected to the substrate.

3. The method of claim 1, further including disposing a plurality of the semiconductor die over the substrate, wherein the heat spreader extends between adjacent semiconductor die.

4. The method of claim 1, further including forming a barrier layer over the semiconductor die as the sidewalls of the recess.

5. The method of claim 1, further including depositing an underfill material between the semiconductor die and substrate.

6. The method of claim 1, further including disposing a discrete electrical device over the substrate.

7. A method of making a semiconductor device, comprising:
   providing a substrate;
   disposing a semiconductor die over the substrate;
   forming a recess in a back surface of the semiconductor die along a perimeter of the semiconductor die;
   forming a thermal interface material over a central area of the back surface of the semiconductor die; and
   disposing a heat spreader over the semiconductor die with a portion of the thermal interface material disposed in the recess.

8. The method of claim 7, wherein the heat spreader includes an opening over the back surface of the semiconductor die.

9. The method of claim 8, wherein the thermal interface material is pressed into the opening when disposing the heat spreader.

10. The method of claim 7, further including depositing an underfill material between the semiconductor die and substrate.

11. The method of claim 7, further including disposing a discrete electrical device over the substrate.

12. The method of claim 7, further including forming a barrier layer over the semiconductor die as sidewalls of the recess.

13. A semiconductor device, comprising:
   a substrate;
   a semiconductor die disposed over the substrate;
   a recess formed over a back surface of the semiconductor die to an edge of the semiconductor die with sidewalls of the recess on at least two sides of the semiconductor die;
   a thermal interface material deposited in the recess; and
   a heat spreader disposed in the recess.

14. The semiconductor device of claim 13, wherein a down leg portion of the heat spreader is thermally connected to the substrate.

15. The semiconductor device of claim 13, further including a plurality of the semiconductor die disposed over the substrate, wherein the heat spreader extends between adjacent semiconductor die.

16. The semiconductor device of claim 13, further including a barrier layer formed over the semiconductor die as the sidewalls of the recess.

17. The semiconductor device of claim 13, further including an underfill material deposited between the semiconductor die and substrate.

18. A semiconductor device, comprising:
   a substrate;
   a semiconductor die disposed over the substrate;
   a recess formed in a back surface of the semiconductor die to an edge of the semiconductor die with sidewalls on at least two sides of the semiconductor die;
   a thermal interface material formed in the recess; and a heat spreader disposed in the recess with a down leg portion of the heat spreader thermally connected to the substrate.

19. The semiconductor device of claim 18, wherein the heat spreader includes an opening over the back surface of the semiconductor die.

20. The semiconductor device of claim 18, further including a barrier layer formed over the semiconductor die as the sidewalls of the recess.

21. The semiconductor device of claim 18, further including an underfill material deposited between the semiconductor die and substrate.

22. The semiconductor device of claim 18, further including a plurality of the semiconductor die disposed over the substrate, wherein the heat spreader extends between adjacent semiconductor die.

23. A semiconductor device, comprising:
a substrate;
a semiconductor die disposed over the substrate and including a recess formed in a back surface along a perimeter of the semiconductor die;
a thermal interface material formed over a central area of the back surface of the semiconductor die; and
a heat spreader disposed over the semiconductor die with a portion of the thermal interface material disposed in the recess.

24. The semiconductor device of claim 23, further including a plurality of the semiconductor die disposed over the substrate, wherein the heat spreader extends between adjacent semiconductor die.

25. The semiconductor device of claim 23, further including a barrier layer formed on at least two sides of the semiconductor die.

26. The semiconductor device of claim 23, further including an underfill material deposited between the semiconductor die and substrate.

27. The semiconductor device of claim 23, further including a discrete electrical device disposed over the substrate.

28. The semiconductor device of claim 13, further including a discrete electrical device disposed over the substrate.

29. A semiconductor device, comprising:
a semiconductor die;
a thermal interface material formed over a perimeter of a back surface of the semiconductor die; and
a heat spreader disposed over the thermal interface material with a central opening of the heat spreader extending completely through the heat spreader over the semiconductor die.

30. The semiconductor device of claim 29, wherein the central opening of the heat spreader is disposed over a central area of the semiconductor die with the central area of the semiconductor die devoid of the heat spreader.

31. The semiconductor device of claim 29, further including the semiconductor die disposed over a substrate.

32. The semiconductor device of claim 31, wherein the heat spreader includes a down leg portion thermally connected to the substrate.

* * * * *